(12) United States Patent
Chung et al.

(10) Patent No.: US 10,910,231 B2
(45) Date of Patent: Feb. 2, 2021

(54) METHOD OF FABRICATING SEMICONDUCTOR DEVICE

(71) Applicant: SAMSUNG ELECTRONICS CO., LTD., Suwon-si (KR)

(72) Inventors: Sanggyo Chung, Anyang-si (KR); Kyoung Ha Eom, Yongin-si (KR); Hyunchul Lee, Hwaseong-si (KR); Sounghee Lee, Hwaseong-si (KR); Jiseung Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/453,481

(22) Filed: Jun. 26, 2019

(65) Prior Publication Data

US 2020/0111678 A1 Apr. 9, 2020

(30) Foreign Application Priority Data

Oct. 4, 2018 (KR) ........................ 10-2018-0118210

(51) Int. Cl.
*H01L 21/311* (2006.01)
*H01L 21/308* (2006.01)

(52) U.S. Cl.
CPC .... *H01L 21/31144* (2013.01); *H01L 21/3086* (2013.01)

(58) Field of Classification Search
CPC ............................................... H01L 21/31144
See application file for complete search history.

(56) References Cited

U.S. PATENT DOCUMENTS

| 6,057,081 | A  | * | 5/2000  | Yunogami | ......... | H01L 21/02071 |
|-----------|----|---|---------|----------|-----------|---------------|
|           |    |   |         |          |           | 430/313       |
| 6,835,662 | B1 | * | 12/2004 | Erhardt  | ............... | H01L 21/0337 |
|           |    |   |         |          |           | 257/E21.038   |
| 7,202,128 | B1 | * | 4/2007  | Orimoto  | ............... | H01L 27/115 |
|           |    |   |         |          |           | 257/368       |
| 7,943,442 | B2 | * | 5/2011  | Gehring  | ............. | H01L 21/8221 |
|           |    |   |         |          |           | 257/E21.195   |
| 8,110,506 | B2 |   | 2/2012  | Min et al. |         |               |
| 8,242,022 | B2 |   | 8/2012  | Kim      |           |               |
| 9,324,574 | B2 |   | 4/2016  | Kang     |           |               |

(Continued)

FOREIGN PATENT DOCUMENTS

| KR | 10-2015-0104476 | 9/2015 |
| KR | 10-2017-0042056 | 4/2017 |

*Primary Examiner* — William Coleman
(74) *Attorney, Agent, or Firm* — F. Chau & Associates, LLC

(57) ABSTRACT

A method of fabricating a semiconductor device includes forming a first etching pattern structure and a second etching pattern structure on a substrate. The first cell etching pattern structure has a top surface at a level that is different from that of a top surface of the second etching pattern structure. The method further includes forming a first spacer layer on the first etching pattern structure and the second etching pattern structure. The first spacer layer covers top and lateral surfaces of the first etching pattern structure and top and lateral surfaces of the second etching pattern structure. The method further includes performing a first etching process on the first spacer layer to form a first spacer and a second spacer. The first spacer layer is fully exposed during the first etching process of the first spacer layer.

20 Claims, 21 Drawing Sheets

(56) References Cited

U.S. PATENT DOCUMENTS

| | | | |
|---|---|---|---|
| 9,837,273 B2* | 12/2017 | Lee | H01L 27/10844 |
| 2008/0017992 A1 | 1/2008 | Kito et al. | |
| 2008/0070165 A1* | 3/2008 | Fischer | H01L 21/0338 |
| | | | 430/314 |
| 2008/0254584 A1* | 10/2008 | Choi | H01L 27/105 |
| | | | 438/258 |
| 2010/0075503 A1 | 3/2010 | Bencher et al. | |
| 2010/0270608 A1 | 10/2010 | Pham et al. | |

* cited by examiner

METHOD OF FABRICATING SEMICONDUCTOR DEVICE

CROSS-REFERENCE TO RELATED APPLICATION

This U.S. nonprovisional application claims priority under 35 U.S.C § 119 to Korean Patent Application No. 10-2018-0118210 filed on Oct. 4, 2018 in the Korean Intellectual Property Office, the disclosure of which is incorporated by reference herein in its entirety.

TECHNICAL FIELD

The present inventive concept relates to a semiconductor device, and more particularly to a method of fabricating a semiconductor device.

DISCUSSION OF THE RELATED ART

Semiconductor devices may be made to have a small size, multi-functionality, and/or low fabrication cost. Semiconductor devices may be categorized as semiconductor memory devices that store logic data, semiconductor logic devices that process operations of logic data, and/or hybrid semiconductor devices that have both memory and logic elements. Semiconductor devices have been increasingly utilized in, for example, high integration circuits and electronic devices. Semiconductor devices may be highly reliable, high speed, and/or able to perform multiple functions.

SUMMARY

According to an exemplary embodiment of the present inventive concept, a method of fabricating a semiconductor device includes: forming a first etching pattern structure and a second etching pattern structure on a substrate, wherein the first cell etching pattern structure has a top surface at a level that is different from that of a top surface of the second etching pattern structure, wherein the first etching pattern structure includes a first cell etching pattern and a second cell etching pattern sequentially stacked on the substrate, wherein the second etching pattern structure includes a first peripheral etching pattern and a second peripheral etching pattern sequentially stacked on the substrate; forming a first spacer layer on the first etching pattern structure and the second etching pattern structure, wherein the first spacer layer covers top and lateral surfaces of the first etching pattern structure and top and lateral surfaces of the second etching pattern structure; and performing a first etching process on the first spacer layer to form a first spacer on a lateral surface of the first cell etching pattern and a second spacer on the lateral surface of the second etching pattern structure, wherein the first spacer layer is fully exposed during the first etching process of the first spacer layer.

According to an exemplary embodiment of the present inventive concept, a method of fabricating a semiconductor device includes: forming a first etching layer, a second cell etching pattern, and a second peripheral etching pattern on a substrate, wherein the second cell etching pattern and the second peripheral etching pattern are formed on a top surface of the first etching layer; recessing the top surface of the first etching layer, wherein the top surface of the first etching layer is exposed by the second cell etching pattern and the second peripheral etching pattern; and performing a first etching process on the second cell etching pattern and the second peripheral etching pattern. The second cell etching pattern is formed to have a top surface at a lower level than a level of a top surface of the second peripheral etching pattern.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Exemplary embodiments of the present inventive concept will be described in more detail below with reference to the accompanying drawings, in which exemplary embodiments of the preset inventive concept are shown.

FIGS. 1A, 1B, 1C, 1D, 1E, 1F, 1G, 1H and 1I are cross-sectional views illustrating a method of fabricating a semiconductor device according to an exemplary embodiment of the present inventive concept.

Figure 1A:
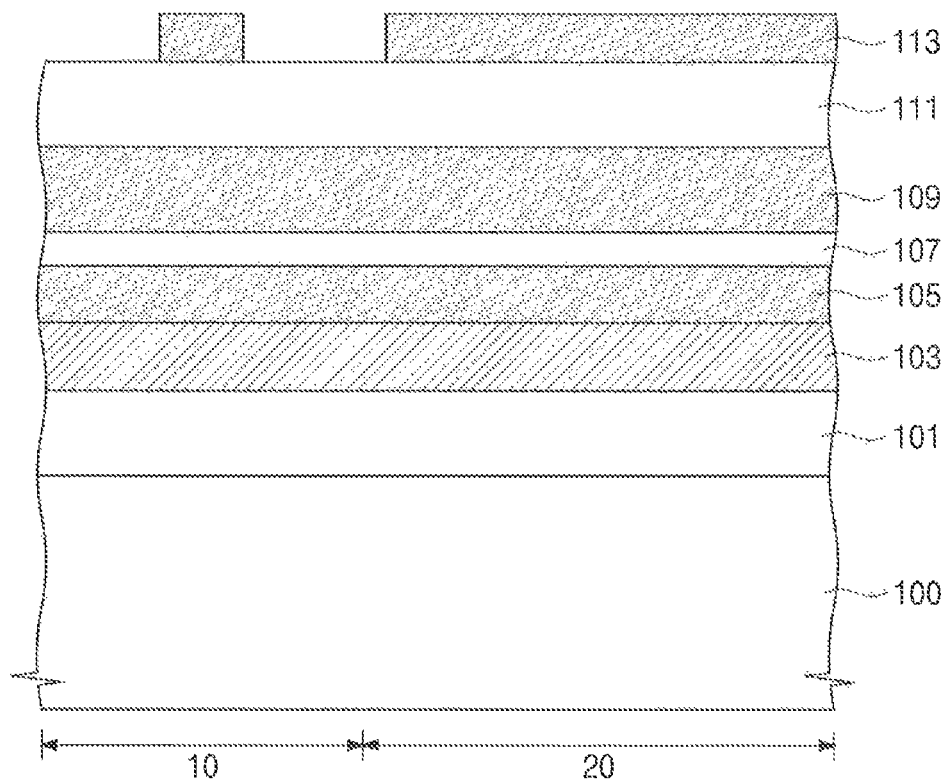
FIGS. 1A, 1B, 1C, 1D, 1E, 1F, 1G, 1H and 1I are cross-sectional views illustrating a method of fabricating a semiconductor device according to an exemplary embodiment of the present inventive concept.

Referring to FIG. 1A, a first etching layer 101, a second etching layer 103, a third etching layer 105, a fourth etching layer 107, a fifth etching layer 109, a sixth etching layer 111, and a first mask pattern 113 may be sequentially formed on a substrate 100. The substrate 100 may include a cell region 10 and a peripheral circuit region 20. The substrate 100 may be, for example, a silicon substrate. The first etching layer 101 may be formed on a top surface of the substrate 100. The first etching layer 101 may include a material having an etch selectivity with respect to the substrate 100. The first etching layer 101 may include, for example, an oxide layer. The second etching layer 103 may be formed on a top surface of the first etching layer 101. The second etching layer 103 may include a material having an etch selectivity with respect to the first etching layer 101. The second etching layer 103 may include, for example, a polysilicon layer. The third etching layer 105 may be formed on a top surface of the second etching layer 103. The third etching layer 105 may include a material having an etch selectivity with respect to the second etching layer 103. The third etching layer 105 may be, for example, an amorphous carbon layer. The fourth etching layer 107 may be formed on a top surface of the third etching layer 105. The fourth etching layer 107 may include a material having an etch selectivity with respect to the third etching layer 105. The fourth etching layer 107 may be, for example, a silicon oxynitride layer. For example, the fourth etching layer 107 may include a polysilicon layer and an oxide layer that are formed on the third etching layer 105. For example, the polysilicon layer and the oxide layer may be sequentially formed on the third etching layer 105. The fifth etching layer 109 may be formed on a top surface of the fourth etching layer 107. For example, the fifth etching layer 109 may be formed thicker than the third etching layer 105. The fifth etching layer 109 may include a material having an etch selectivity with respect to the fourth etching layer 107. The fifth etching layer 109 may be, for example, a spin-on-hardmask layer. The sixth etching layer 111 may be formed on a top surface of the fifth etching layer 109. The sixth etching layer 111 may include a material having an etch selectivity with respect to the fifth etching layer 109. The sixth etching layer 111 may be, for example, a silicon oxynitride layer. The first mask pattern 113 may be disposed on a top surface of the sixth etching layer 111. The first mask pattern 113 may be, for example, a photoresist pattern.

Figure 1B:
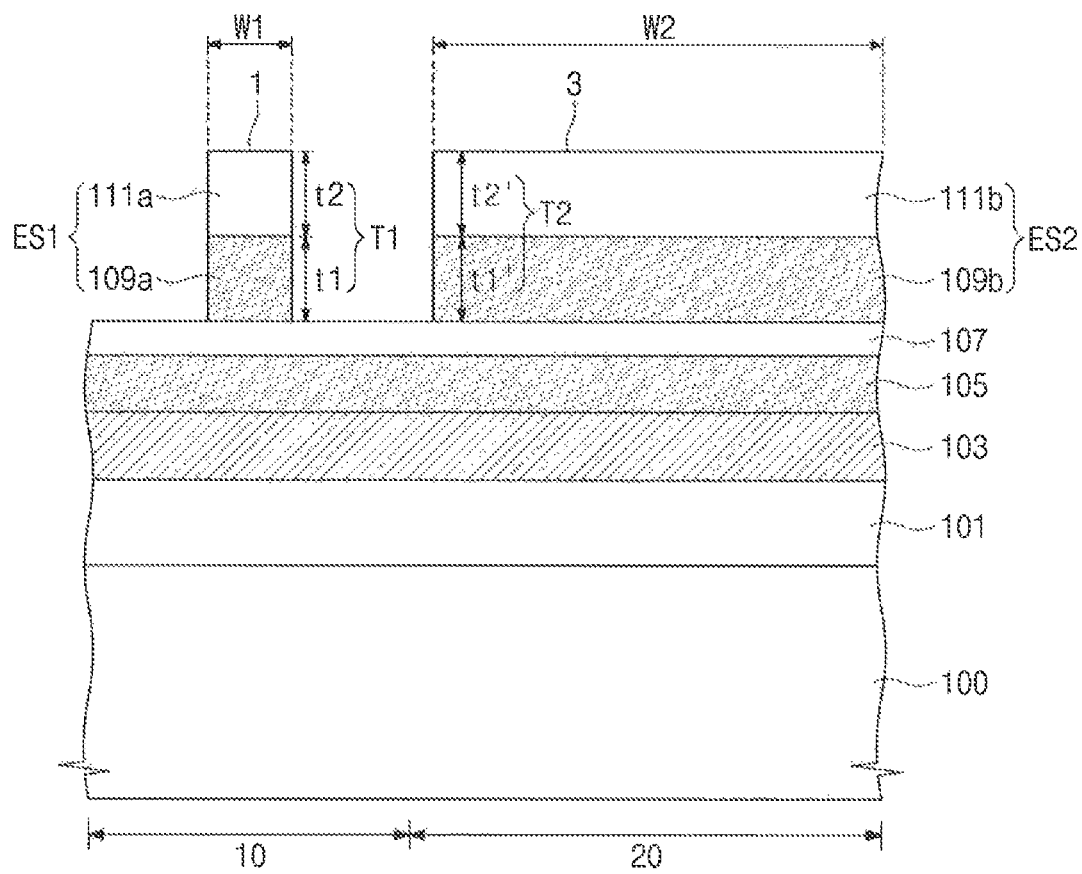

Referring to FIG. 1B, the first mask pattern 113 may be used as an etching mask to pattern the sixth etching layer 111 and the fifth etching layer 109. After patterning of the sixth etching layer 111 and the fifth etching layer 109, a first etching pattern structure ES1 and a second etching pattern structure ES2 may be formed on the substrate 100. The first etching pattern structure ES1 may be formed on the cell region 10 of the substrate 100, and the second etching pattern structure ES2 may be formed on the peripheral circuit region 20 of the substrate 100. For example, the first etching pattern structure ES1 may have a first width W1 less than a second width W2 of the second etching pattern structure ES2 (e.g., W1<W2). The first and second etching pattern structures ES1 and ES2 may expose portions of the top surface of the fourth etching layer 107. The first mask pattern 113 may be removed when the sixth and fifth etching layers 111 and 109 are patterned. The first etching pattern structure ES1 may include a fifth cell etching pattern 109*a* (e.g., a fifth cell etching layer) and a sixth cell etching pattern 111*a* (e.g., a sixth cell etching layer) that are sequentially formed on the top surface of the fourth etching layer 107. The second etching pattern structure ES2 may include a fifth peripheral etching pattern 109*b* (e.g., a fifth peripheral etching layer) and a sixth peripheral etching pattern 111*b* (e.g., a sixth peripheral etching layer) that are sequentially formed on the top surface of the fourth etching layer 107.

The first etching pattern structure ES1 may have a top surface 1 at the same level as that of a top surface 3 of the second etching pattern structure ES2. The top surface 1 of the first etching pattern structure ES1 may correspond to a top surface of the sixth cell etching pattern 111*a*, and the top surface 3 of the second etching pattern structure ES2 may correspond to a top surface of the sixth peripheral etching pattern 111*b*. The first etching pattern structure ES1 may have a thickness T1 substantially the same as a thickness T2 of the second etching pattern structure ES2. For example, the fifth cell etching pattern 109*a* may have a thickness t1 substantially the same as a thickness t1' of the fifth peripheral etching pattern 109*b*, and the sixth cell etching pattern 111*a* may have a thickness t2 substantially the same as a thickness t2' of the sixth peripheral etching pattern 111*b*. However, the present inventive concept is not limited thereto. For example, the thickness t2 of the sixth cell etching pattern 111*a* may be less than or greater than the thickness t2' of the sixth peripheral etching pattern 111*b*. However, a difference between the thickness t2 of the sixth cell etching pattern 111*a* and the thickness t2' of the sixth peripheral etching pattern 111*b* might not be sufficiently enough to skip an etching process which will be discussed below with reference to FIG. 1C.

Figure 1C:
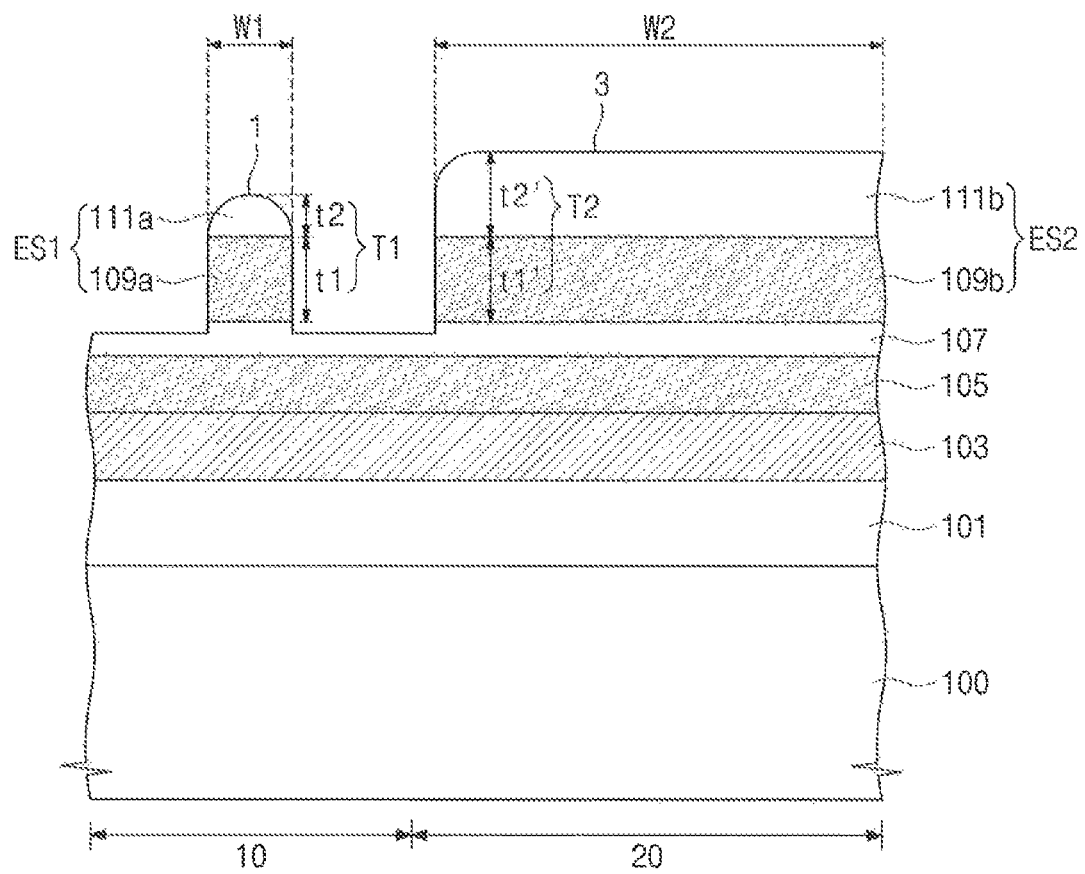

Referring to FIG. 1C, an etching process may be performed on the first etching pattern structure ES1 and the second etching pattern structure ES2. For example, the etching process may use an etching gas to etch the sixth cell etching pattern 111*a* and the sixth peripheral etching pattern 111*b*. The etching gas may include, for example, CF4 and CHF3. When the etching process is performed on the sixth cell etching pattern 111*a* and the sixth peripheral etching pattern 111*b*, the etching process may etch the fourth etching layer 107 exposed by the first and second etching pattern structures ES1 and ES2. For example, the top surface of the fourth etching layer 107 may be recessed at its portions that are exposed by the first and second etching pattern structures ES1 and ES2. For example, when the fourth etching layer 107 includes a polysilicon layer and a silicon oxide layer that are different from a material of the sixth etching layer 111, the portions of the top surface of the fourth etching layer 107 might not be recessed.

For example, the etching process may cause the thickness T1 of the first etching pattern structure ES1 to become less than the thickness T2 of the second etching pattern structure ES2 (e.g., T1<T2). For example, the etching process may reduce the thickness t2 of the sixth cell etching pattern 111*a* and may reduce the thickness t2' of the sixth peripheral etching pattern 111*b*. In this case, the thickness t2 of the sixth cell etching pattern 111*a* may be less than the thickness t2' of the sixth peripheral etching pattern 111*b*. In this sense, an etching amount of the sixth cell etching pattern 111*a* may be greater than that of the sixth peripheral etching pattern 111*b*. For example, the etching process may reduce the thickness t2 of the sixth cell etching pattern 111*a*, but may hardly reduce the thickness t2' of the sixth peripheral etching pattern 111*b*. For example, the etching process might not reduce the thickness t2' of the sixth peripheral etching pattern 111*b* as much as the thickness t2 of the sixth cell etching pattern 111*a*. In addition, the sixth peripheral etching pattern 111*b* may be scarcely etched while the sixth cell etching pattern 111*a* is etched. The etching process may cause the top surface 1 of the first etching pattern structure ES1 to reside at a different level from that of the top surface 3 of the second etching pattern structure ES2. For example, the top surface 1 of the sixth cell etching pattern 111*a* may be located at a lower level than that of the top surface 3 of the sixth peripheral etching pattern 111*b*. The top surface 1 of the sixth cell etching pattern 111*a* may have a dome shape or a semi-circular shape.

When the first width W1 of the sixth cell etching pattern 111*a* is less than the second width W2 of the sixth peripheral etching pattern 111*b*, the sixth cell etching pattern 111*a* may be vertically etched in a large amount because the sixth cell etching pattern 111*a* undergoes the etching process at its top surface 1 and its top corner as well. In addition, the sixth peripheral etching pattern 111*b* may be vertically etched in a smaller amount than that of the sixth cell etching pattern 111*a* because an etching action on the top surface 3 of the sixth peripheral etching pattern 111*b* does not overlap an etching action on a top corner of the sixth peripheral etching pattern 111*b*. For example, in the same etching process, the sixth cell etching pattern 111*a* may have an etching resistance less than that of the sixth peripheral etching pattern 111*b*. In this case, in the same etching process using the same recipe, a so-called three-dimensional etching effect may occur such that an etching amount of the sixth cell etching pattern 111a may be greater than that of the sixth peripheral etching pattern 111b. The greater the difference in line width between the sixth cell etching pattern 111a and the sixth peripheral etching pattern 111b, the larger the difference in thickness between the sixth cell etching pattern 111a and the sixth peripheral etching pattern 111b and/or in level (e.g., difference in height, in a vertical direction) between the top surface 1 of the sixth cell etching pattern 111a and the top surface 3 of the sixth peripheral etching pattern 111b. When the sixth cell etching pattern 111a is large in size, the sixth cell etching pattern 111a and the sixth peripheral etching pattern 111b may have a small (e.g., an insufficient) difference in thickness therebetween and/or in level (e.g., height) between the top surfaces 1 and 3 thereof, but an additional difference in thickness and/or in level may be obtained by increasing a thickness of the sixth etching layer 111 and through an etching process of the sixth cell etching pattern 111a and the sixth peripheral etching pattern 111b.

Figure 1D:
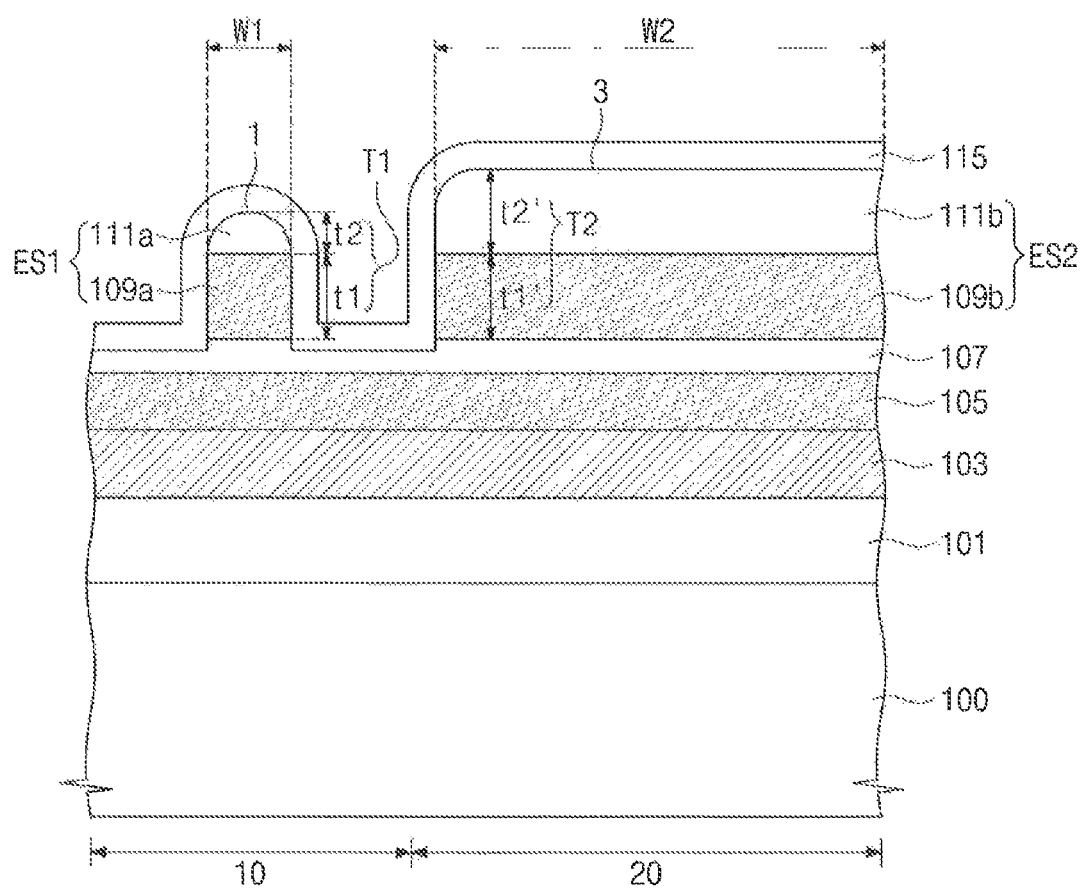

Referring to FIG. 1D, a first spacer layer 115 may be formed on the fourth etching layer 107. The first spacer layer 115 may be conformally disposed on surfaces of the first and second etching pattern structures ES1 and ES2, and may be disposed on the top surface of the fourth etching layer 107, which is exposed by the first and second etching pattern structures ES1 and ES2. For example, the first spacer 115 may cover surfaces of the first and second etching pattern structures ES1 and ES2, and may cover the top surface of the fourth etching layer 107. For example, the first spacer layer 115 may conformally cover lateral surfaces of the fifth cell and peripheral etching patterns 109a and 109b, the top surfaces 1 and 3 of the sixth cell and peripheral etching patterns 111a and 111b, and lateral surfaces of the sixth cell and peripheral etching patterns 111a and 111b. For example, the first spacer layer 115 may be formed by atomic layer deposition (ALD). The first spacer layer 115 may be, for example, an oxide layer.

Figure 1E:
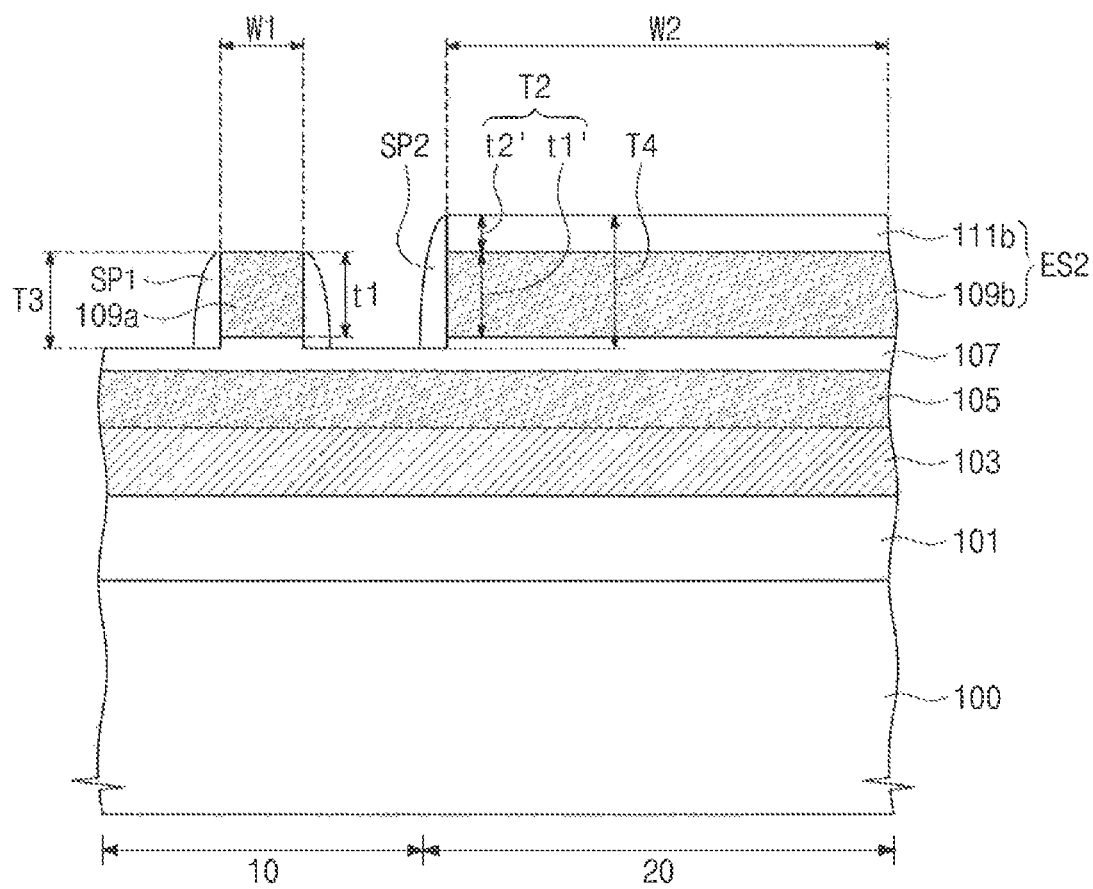

Referring to FIG. 1E, the first spacer layer 115 may undergo an etching process to form a first spacer SP1 and a second spacer SP2. The first spacer SP1 may be formed on a lateral surface of the fifth cell etching pattern 109a, and the second spacer SP2 may be formed on a lateral surface of the second etching pattern structure ES2. The formation of the first and second spacers SP1 and SP2 may include exposing the top surfaces 1 and 3 of the sixth cell and peripheral etching patterns 111a and 111b by etching the first spacer layer 115, and exposing a top surface of the fifth cell etching pattern 109a by etching the sixth cell etching pattern 111a and by partially etching the sixth peripheral etching pattern 111b. The thickness t2' of the sixth peripheral etching pattern 111b may be much larger than the thickness t2 of the sixth cell etching pattern 111a, and the sixth peripheral etching pattern 111b may be etched until the sixth cell etching pattern 111a is completely etched to expose the top surface of the fifth cell etching pattern 109a. Accordingly, the sixth peripheral etching pattern 111a may remain on the top surface of the fifth peripheral etching pattern 109b after the sixth cell etching pattern 111a has been completely etched. Thus, because the fifth peripheral etching pattern 109b has a top surface covered with the sixth peripheral etching pattern 111b, the fifth peripheral etching pattern 109b may be sufficiently preserved for subsequent processes. The etching process may be performed in a state that the first spacer layer 115 is fully exposed while covering the top surface 3 and the lateral surface of the sixth peripheral etching pattern 111b and also covering a lateral surface of the fifth peripheral etching pattern 109b. For example, the etching process may be carried out in a state that any other mask does not cover the first spacer layer 115 formed on the peripheral circuit region 20 of the substrate 100. The first spacer SP1 may have a thickness T3 greater than the thickness t1 of the fifth cell etching pattern 109a, and the second spacer SP2 may have a thickness T4 greater than the thickness T2 of the second etching pattern structure ES2. The thickness T3 of the first spacer SP1 may be less than the thickness T4 of the second spacer SP2 (T3<T4). An etchback process or a dry etching process may be performed as the etching process.

Figure 1F:
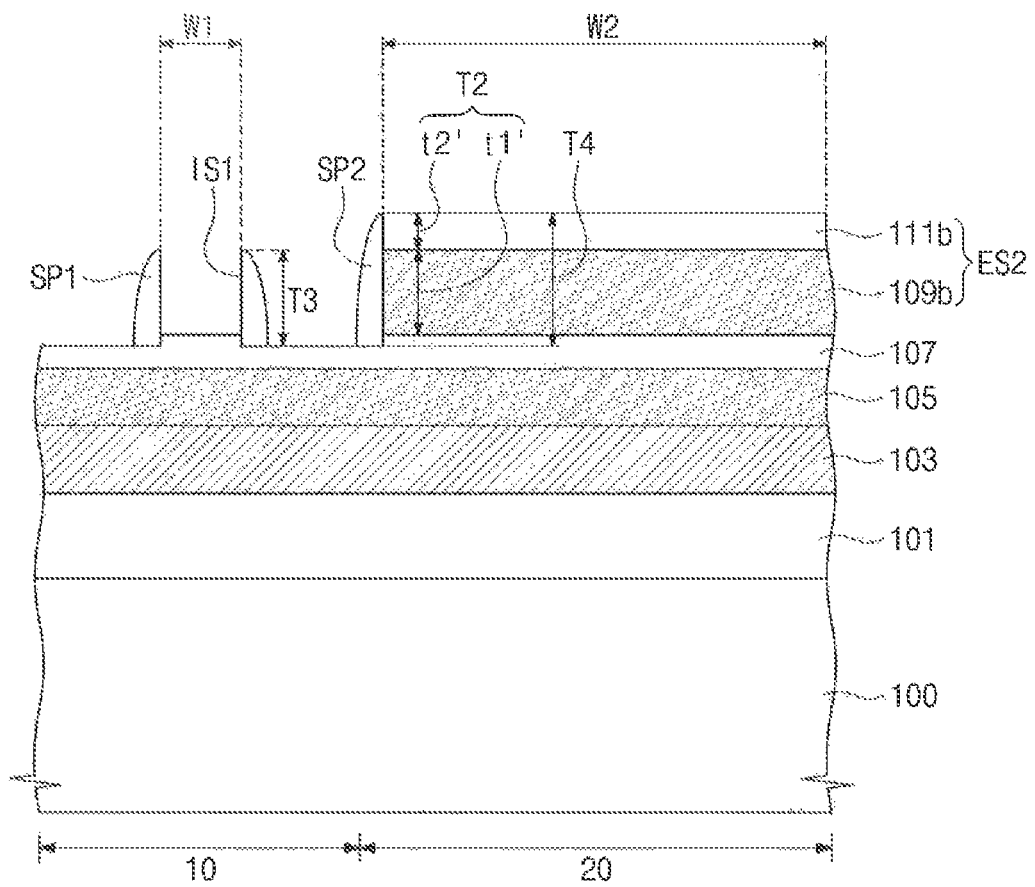

Referring to FIG. 1F, the fifth cell etching pattern 109a may be removed to expose an inner sidewall IS1 of the first spacer SP1. The fifth peripheral etching pattern 109b may be protected by the sixth peripheral etching pattern 111b and the second spacer SP2, and thus might not be etched while the fifth cell etching pattern 109a is removed. For example, an in-situ dry etching process or an ashing process may be performed to remove the fifth cell etching pattern 109a.

Figure 1G:
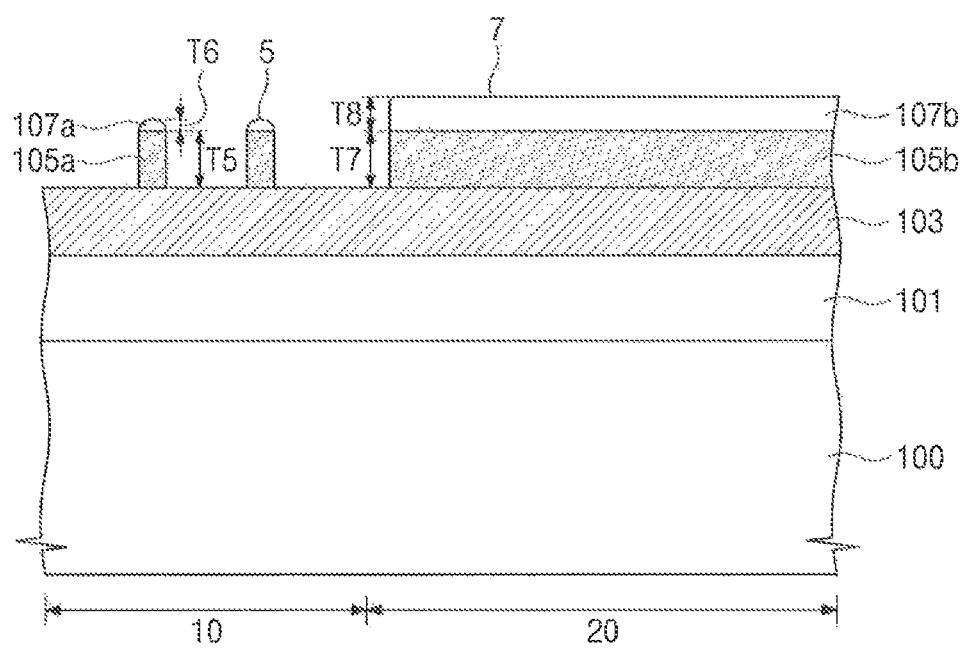

Referring to FIG. 1G, the first spacer SP1, the second spacer SP2, and the second etching pattern structure ES2 may be used as an etching mask in an etching process to sequentially etch the fourth etching layer 107 and the third etching layer 105. Thus, a third cell etching pattern 105a and a fourth cell etching pattern 107a may be formed on the cell region 10 of the substrate 100, and a third peripheral etching pattern 105b and a fourth peripheral etching pattern 107b may be formed on the peripheral circuit region 20 of the substrate 100. The etching process may be performed in a state that any other mask does not cover the second spacer SP2 and the second etching pattern structure ES2. The third cell etching pattern 105a and the fourth cell etching pattern 107a may be sequentially formed on the top surface of the second etching layer 103, and the third peripheral etching pattern 105b and the fourth peripheral etching pattern 107b may be sequentially formed on the top surface of the second etching layer 103. When the fourth etching layer 107 and the third etching layer 105 are etched, the first spacer SP1, the second spacer SP2, and the second etching pattern structure ES2 may also be etched and removed.

The third and fourth cell etching patterns 105a and 107a may be formed using the first spacer SP1 as an etching mask, and the third and fourth peripheral etching patterns 105b and 107b may be formed using the second spacer SP2 and the second etching pattern structure ES2 as an etching mask. A sum of thicknesses T5 and T6 of the third and fourth cell etching patterns 105a and 107a may be less than a sum of thicknesses T7 and T8 of the third and fourth peripheral etching patterns 105b and 107b (T5+T6<T7+T8) because the thickness T3 of the first spacer SP is less than the thickness T4 of the second spacer SP2 and the thickness T2 of the second etching pattern structure ES2 (See FIG. 1E), and because a three-dimensional etching effect occurs at the fourth cell etching pattern 107a while the third cell etching pattern 105a is etched. The thickness T5 of the third cell etching pattern 105a may be substantially the same as the thickness T7 of the third peripheral etching pattern 105b (T5=T7), and the thickness T6 of the fourth cell etching pattern 107a may be less than the thickness T8 of the fourth peripheral etching pattern 107b (T6<T8). For example, the fourth cell etching pattern 107a may have a top surface 5 at a lower level than that of a top surface 7 of the fourth peripheral etching pattern 107b. The etching process may be, for example, a dry etching process.

According to an exemplary embodiment of the present inventive concept, before the first spacer layer 115 is formed, a three-dimensional etching effect may be utilized to increase the difference in level between the top surface 1 of the sixth cell etching pattern 111a and the top surface 3 of the sixth peripheral etching pattern 111b (See FIG. 1C). Therefore, to preserve the fifth peripheral etching pattern 109b that has a large width and that may be used as an etching mask on the peripheral circuit region 20 of the substrate 100 while the fifth cell etching pattern 109a is etched, it may be unnecessary to form on the peripheral circuit region 20 of the substrate 100 a mask pattern to locally expose the cell region 10 of the substrate 100 after the first spacer layer 115 is formed. As a result, a fabrication process may be simplified.

Figure 1H:
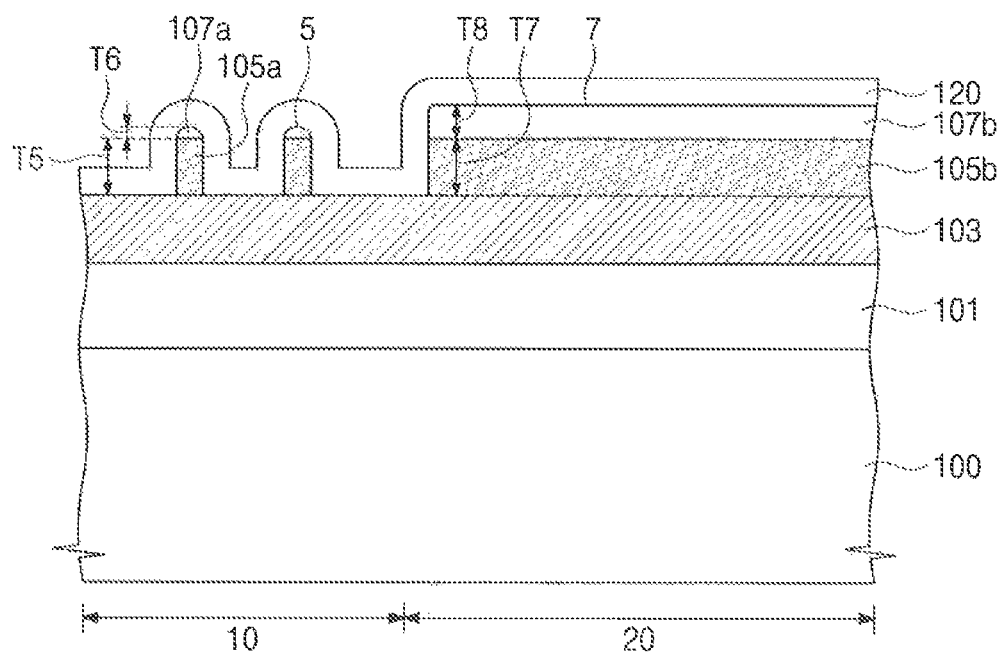

Referring to FIG. 1H, a second spacer layer 120 may be formed on the second etching layer 103. The second spacer layer 120 may conformally cover top and lateral surfaces of the fourth peripheral etching pattern 107b, a lateral surface of the third peripheral etching pattern 105b, a lateral surface of the third cell etching pattern 105a, a top surface of the fourth cell etching pattern 107a, and portions of the top surface of the second etching layer 103 that are exposed by the third cell and peripheral etching patterns 105a and 105b. The second spacer layer 120 may be formed by, for example, atomic layer deposition (ALD). The second spacer layer 120 may be, for example, an oxide layer.

Figure 1I:
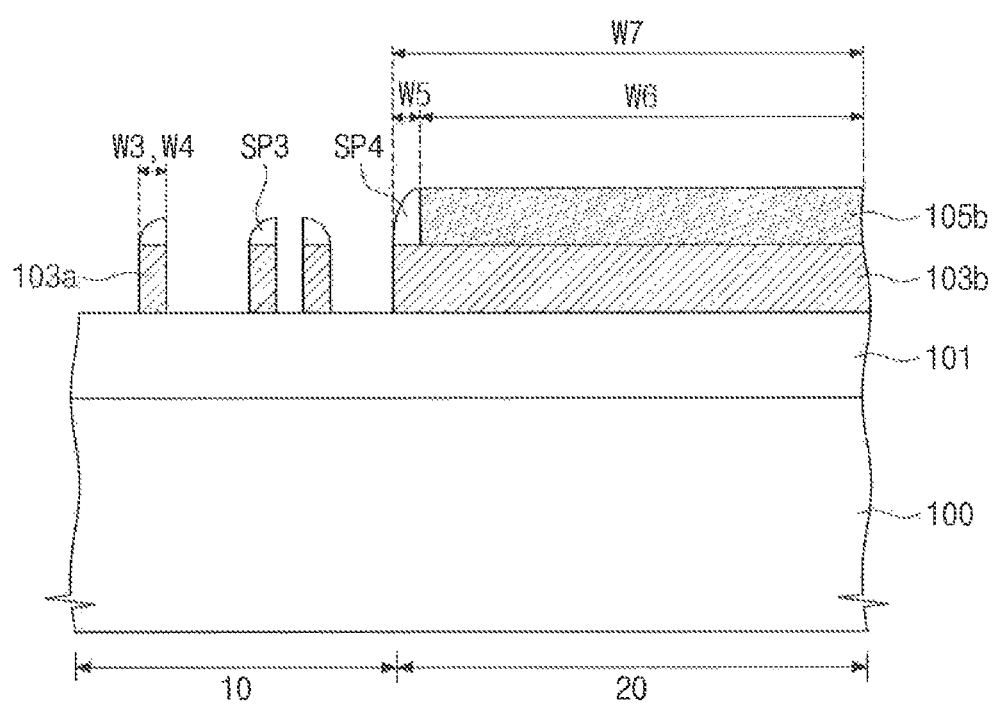

Referring to FIG. 1I, the second spacer layer 120 and the second etching layer 103 may be etched to form a second cell etching pattern 103a, a third spacer SP3, a second peripheral etching pattern 103b, and a fourth spacer SP4. The second cell etching pattern 103a and the third spacer SP3 may be formed on the cell region 10 of the substrate 100, and the second peripheral etching pattern 103b and the fourth spacer SP4 may be formed on the peripheral circuit region 20 of the substrate 100. The second spacer layer 120 may be etched to expose a top surface of the third cell etching pattern 105a and the top surface of the fourth peripheral etching pattern 107b. An etching process may be performed to remove the fourth cell etching pattern 107a. The third spacer SP3 may be formed on the lateral surface of the third cell etching pattern 105a, and the fourth spacer SP4 may be formed on the lateral surface of the third peripheral etching pattern 105b and the lateral surface of the fourth peripheral etching pattern 107b.

The third cell etching pattern 105a may be removed. The third spacer SP3, the fourth spacer SP4, the third peripheral etching pattern 105b, and the fourth peripheral etching pattern 107b might not be etched while the third cell etching pattern 105a is removed. The fourth peripheral etching pattern 107b and the fourth spacer SP4 may cover the third peripheral etching pattern 105b having no etch selectivity with respect to the third cell etching pattern 105a, and thus the third peripheral etching pattern 105b might not be removed when the third cell etching pattern 105a is removed. For example, the third cell etching pattern 105a may be removed by a dry etching process or an ashing process.

The second cell etching pattern 103a and the second peripheral etching pattern 103b may be formed by using the third spacer SP3, the fourth spacer SP4, the third peripheral etching pattern 105b, and the fourth peripheral etching pattern 107b as an etching mask to etch the second etching layer 103. While the second etching layer 103 is etched, the fourth peripheral etching pattern 107b may be removed to expose a top surface of the third peripheral etching pattern 105b and to reduce thicknesses of the third and fourth spacers SP3 and SP4. The third spacer SP3 may be disposed on a top surface of the second cell etching pattern 103a, and the fourth spacer SP4 may be disposed on a top surface of the second peripheral etching pattern 103b and the lateral surface of the third peripheral etching pattern 105b. The second cell etching pattern 103a may have a width W4 in proportion to a width W3 of the third spacer SP3 (W4☐W3), and the second peripheral etching pattern 103b may have a width W7 in proportion to a sum of a width W5 of the fourth spacer SP4 and a width W6 of the third peripheral etching pattern 105b (W7☐W5+W6).

The following will now describe a process of forming an active fin AF and a peripheral fin PF after the step of FIG. 1I.

Figure 2A:
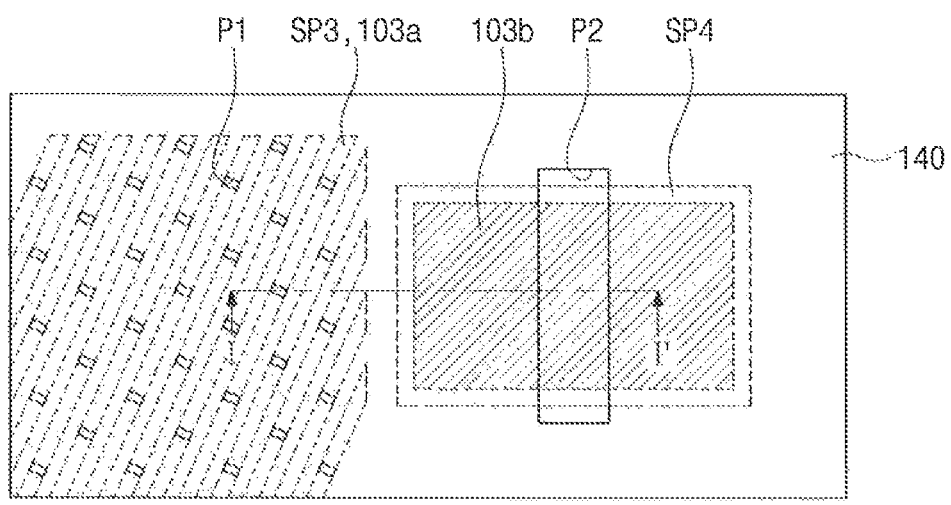
FIGS. 2A and 3A are plan views illustrating a method of fabricating a semiconductor device according to an exemplary embodiment of the present inventive concept.
Figure 2B:
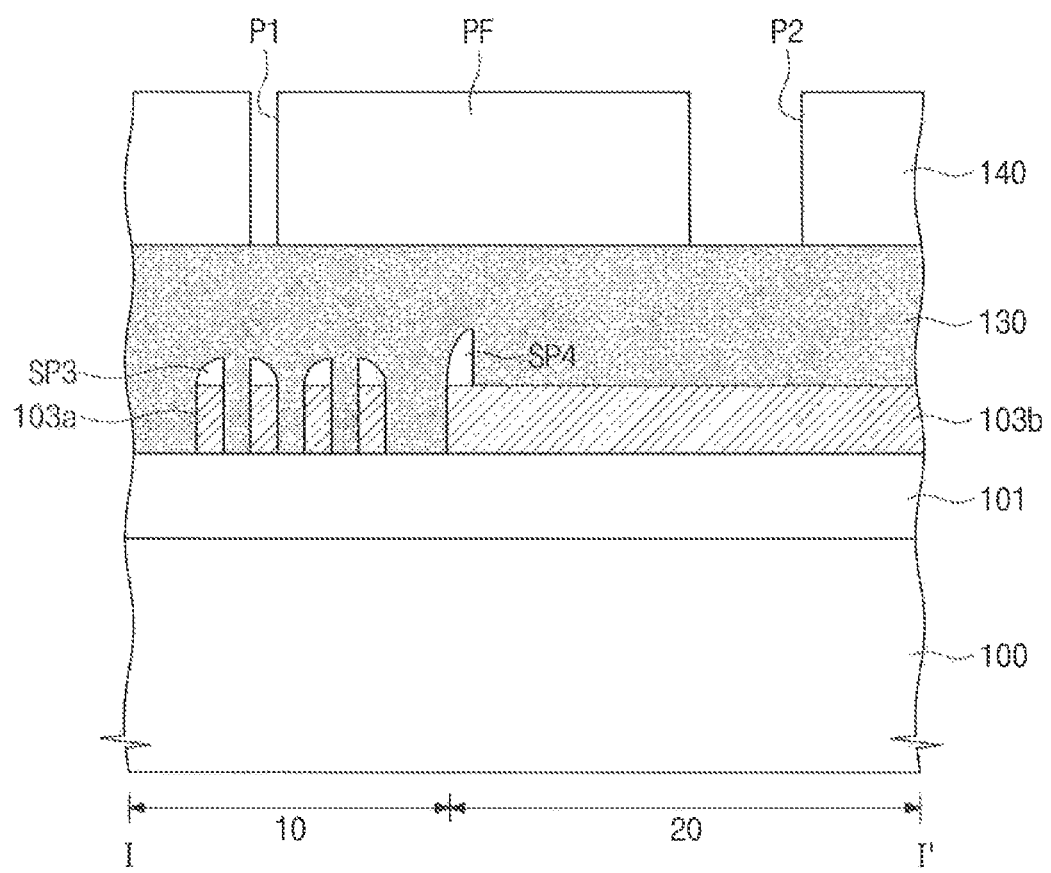
FIGS. 2B, 3B, 4, 5, and 6 are cross-sectional views taken along line I-I' of FIGS. 2A and/or 3A, illustrating a method of fabricating a semiconductor device according to an exemplary embodiment of the present inventive concept.

Referring to FIGS. 2A and 2B, the third peripheral etching pattern 105b may be removed. The removal of the third peripheral etching pattern 105b may expose the top surface of the second peripheral etching pattern 103b. The third and fourth spacers SP3 and SP4 and the second peripheral etching pattern 103b may have an etch selectivity with respect to the third peripheral etching pattern 105b, and thus, might not be etched while the third peripheral etching pattern 105b is etched. A seventh etching layer 130 may be formed on the first etching layer 101. The seventh etching layer 130 may cover the top surface of the first etching layer 101, which top surface is exposed by the third and fourth spacers SP3 and SP4, and the second cell and peripheral etching patterns 103a and 103b. The seventh etching layer 130 may include a material having an etch selectivity with respect to the third spacer SP3. For example, the seventh etching layer 130 may be a spin-on-hardmask (SOH) layer or an amorphous carbon layer (ACL).

A second mask pattern 140 may be formed on the seventh etching layer 130. The second mask pattern 140 may cover a top surface of the seventh etching layer 130. The second mask pattern 140 may include first openings P1 and second openings P2. The first openings P1 may be disposed on the cell region 10 of the substrate 100, and the second openings P2 may be disposed on the peripheral circuit region 20 of the substrate 100. The first openings P1 may vertically overlap portions of the seventh etching layer 130, portions of the second cell etching pattern 103a, and portions of the third spacer SP3, which are disposed on the cell region 10 of the substrate 100. The second openings P2 may vertically overlap portions of the seventh etching layer 130 and portions of the second peripheral etching pattern 103b, which are disposed on the peripheral circuit region 20 of the substrate 100. The second mask pattern 140 may be, for example, a silicon oxynitride layer.

Figure 3A:
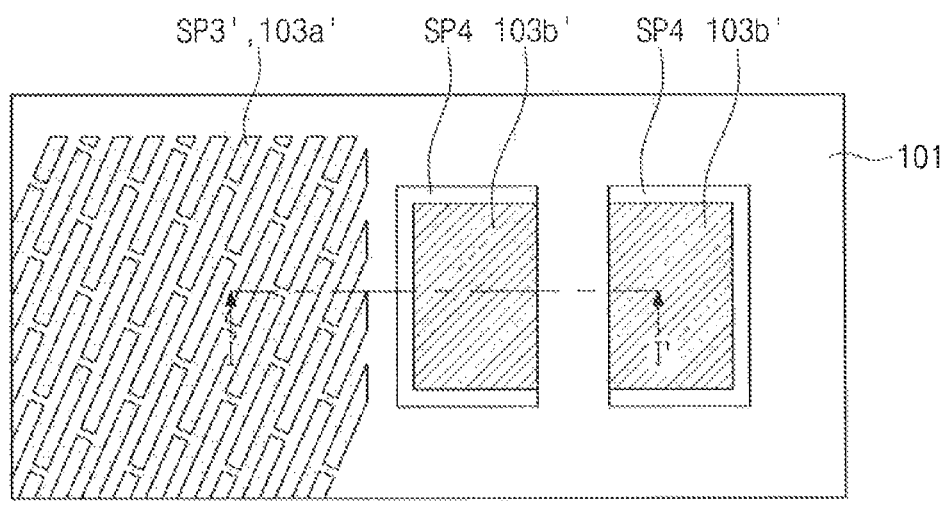
Figure 3B:
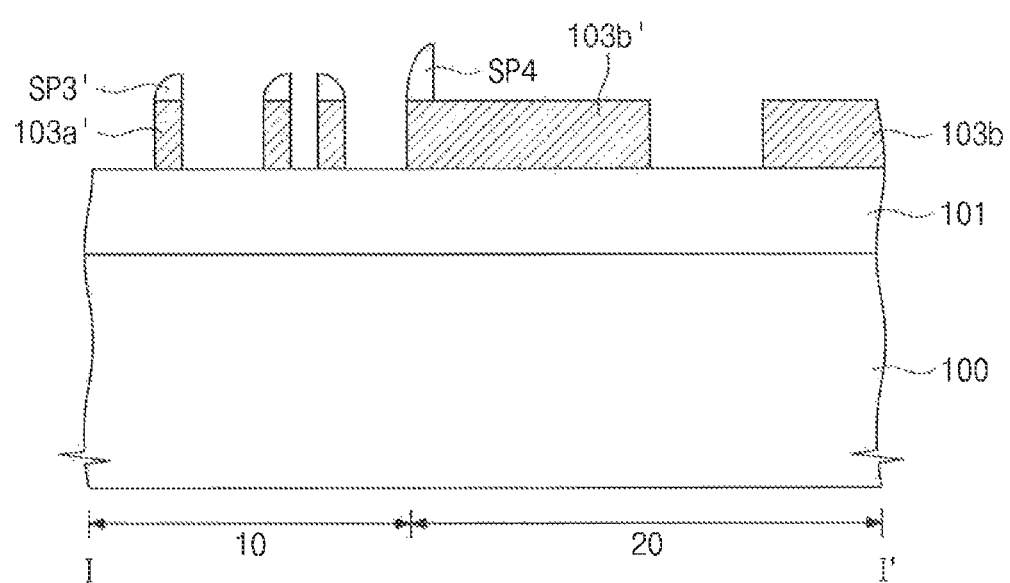

Referring to FIGS. 3A and 3B, an etching process may be performed in which the second mask pattern 140 is used as an etching mask to etch the seventh etching layer 130, the third spacer SP3, the second cell etching pattern 103a, the second peripheral etching pattern 103b, and the fourth spacer SP4. Thus, the third spacer SP3 may be separated into a plurality of third spacer patterns SP3', and the second cell etching pattern 103a may be separated into a plurality of separation patterns 103a'. The second peripheral etching pattern 103b may be separated into a plurality of peripheral separation patterns 103b' during the etching process. In addition, the fourth spacer SP4 may be separated into a plurality of fourth spacer SP4. After the etching process is completed, the second mask pattern 140 and the seventh etching layer 130 may be removed to expose the plurality of separation patterns 103a', the plurality of third spacer patterns SP3', the fourth spacer SP4, and the plurality of peripheral separation patterns 103b'.

Figure 4:
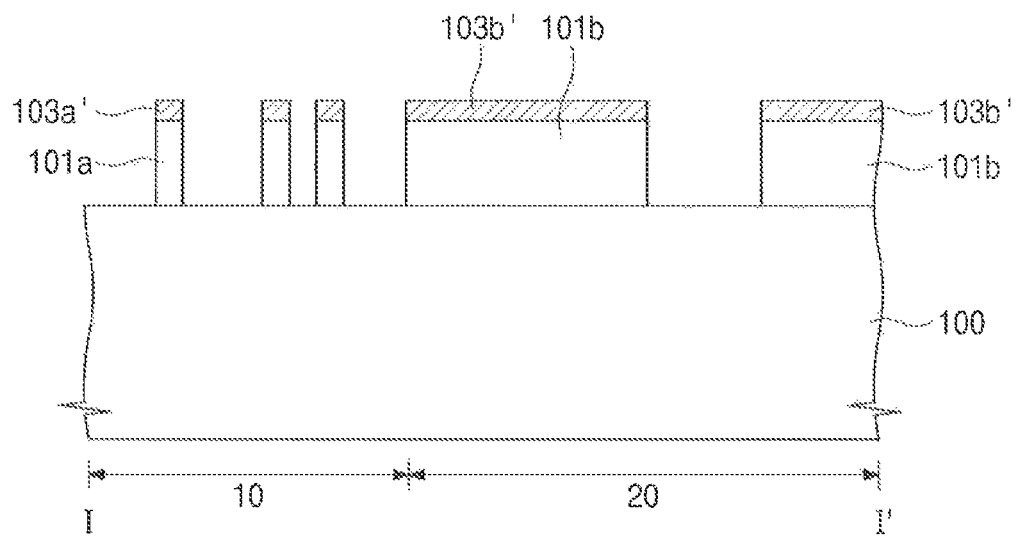

Referring to FIG. 4, an etching process may be performed in which the plurality of separation patterns 103a', the plurality of third spacer patterns SP3', the fourth spacer SP4, and the plurality of peripheral separation patterns 103b' are used as an etching mask to pattern the first etching layer 101. Therefore, first cell etching patterns 101a may be formed, and first peripheral etching patterns 101b may also be formed. The first cell etching patterns 101a may be formed on the cell region 10 of the substrate 100, and the first peripheral etching patterns 101b may be formed on the peripheral circuit region 20 of the substrate 100. When the etching process is performed, the fourth spacer SP4 and the plurality of third spacer patterns SP3' may be removed, and the plurality of separation patterns 103a' and the plurality of peripheral separation patterns 103b' may be reduced in thickness. Each of the plurality of separation patterns 103a' may remain on a top surface of a corresponding first cell etching pattern 101a of the first cell etching patterns 101a, and each of the plurality of peripheral separation patterns 103b' may remain on a top surface of a corresponding first peripheral etching pattern 101b of the first peripheral etching patterns 101b.

Figure 5:
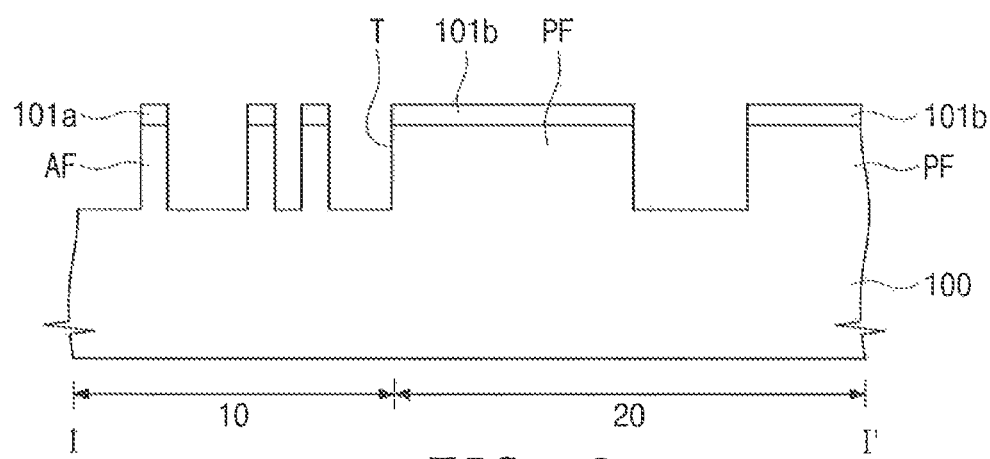

Referring to FIG. 5, an etching process may be performed in which the separation patterns 103a', the first cell etching patterns 101a, the peripheral separation patterns 103b', and the first peripheral etching patterns 101b are used as an etching mask to etch the substrate 100, which may form an active fin AF and a peripheral fin PF. The active fin AF may be formed on the cell region 10 of the substrate 100, and the peripheral fin PF may be formed on the peripheral circuit region 20 of the substrate 100. The active fin AF and the peripheral fin PF may protrude from bottom surfaces of trenches T that are formed by etching the substrate 100. For example, the active fin AF and the peripheral fin PF may protrude from the substrate 100, and thus, the trenches T may be formed. When the etching process is performed, the separation patterns 103a' and the peripheral separation patterns 103b' may be removed, and the first cell etching patterns 101a and the first peripheral etching patterns 101b may be reduced in thickness. The first cell etching patterns 101a may remain on a top surface of the active fin AF, and the first peripheral etching patterns 101b may remain on a top surface of the peripheral fin PF.

Figure 6:
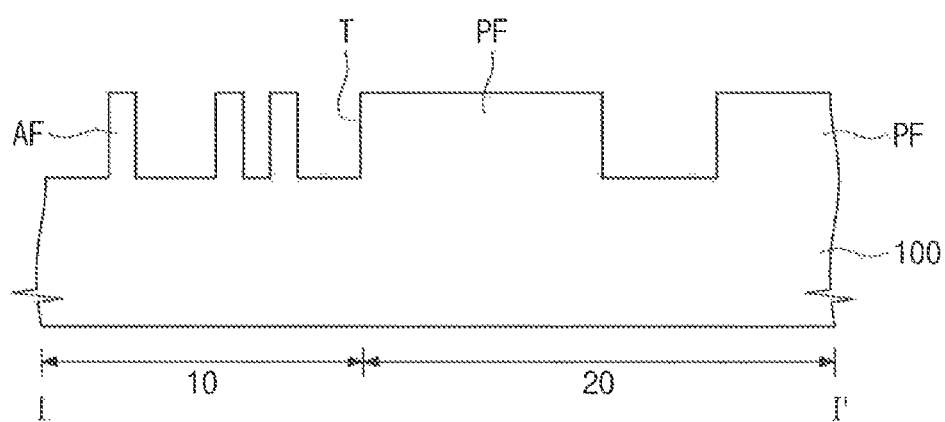

Referring to FIG. 6, a removal process may be performed to remove the first cell etching patterns 101a and the first peripheral etching patterns 101b that are provided on the substrate 100. For example, a wet etching process may be performed as the removal process.

FIGS. 7A, 7B, 7C and 7D are cross-sectional views illustrating a method of fabricating a semiconductor device according to an exemplary embodiment of the present inventive concept. For brevity of description, components that may be assumed to be substantially the same as those of the semiconductor device discussed above may have the same reference numerals thereto, and a detailed explanation thereof may be omitted.

Figure 7A:
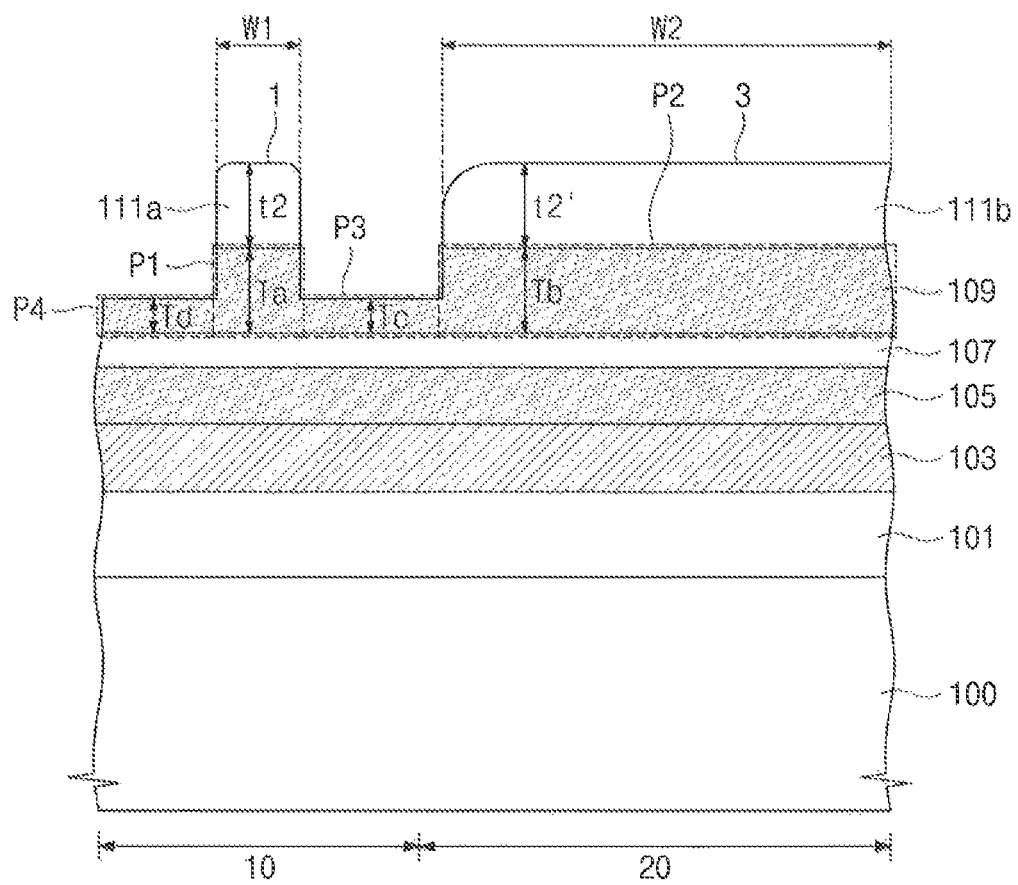
FIGS. 7A, 7B, 7C and 7D are cross-sectional views illustrating a method of fabricating a semiconductor device according to an exemplary embodiment of the present inventive concept.

Referring to FIGS. 1A and 7A, the first mask pattern 113 may be used as an etching mask to etch the sixth etching layer 111 to form the sixth cell etching pattern 111a and the sixth peripheral etching pattern 111b. The thickness t2 of the sixth cell etching pattern 111a may be substantially the same as the thickness t2' of the sixth peripheral etching pattern 111b. The top surface 1 of the sixth cell etching pattern 111a may be located at substantially the same level as that of the top surface 3 of the sixth peripheral etching pattern 111b. A recess process may be performed in which the sixth cell etching pattern 111a and the sixth peripheral etching pattern 111b are used as an etching mask to recess portions of the top surface of the fifth etching layer 109. The recess process may use a first etching condition that has an etch selectivity with respect to the sixth cell etching pattern 111a and the sixth peripheral etching pattern 111b. For example, under the first etching condition, the fifth etching layer 109 may be etched faster than the sixth cell etching pattern 111a and the sixth peripheral etching pattern 111b. For example, the first etching condition may include using a first etching gas that has an etch selectivity with respect to the sixth cell etching pattern 111a and the sixth peripheral etching pattern 111b. The width W1 of the sixth cell etching pattern 111a may be less than the width W2 of the sixth peripheral etching pattern 111b (W1<W2).

The fifth etching layer 109 may include a first segment P1 formed below the sixth cell etching pattern 111a, a second segment P2 formed below the sixth peripheral etching pattern 111b, a third segment P3 formed between the sixth cell etching pattern 111a and the sixth peripheral etching pattern 111b, and a fourth segment P4 formed between a plurality of neighboring sixth cell etching patterns 111a. The first segment P1 may have a thickness Ta the same as a thickness Tb of the second segment P2 (Ta=Tb). The third segment P3 may have a thickness Tc the same as a thickness Td of the fourth segment P4 (Tc=Td). The thickness Ta of the first segment P1 and the thickness Tb of the second segment P2 may be greater than the thickness Tc of the third segment P3 and the thickness Td of the fourth segment P4 (Ta, Tb>Tc, Td). In an exemplary embodiment of the present inventive concept, the thickness Ta of the first segment P1 and/or the thickness Tb of the second segment P2 may be greater than a sum of the thickness Tc of the third segment P3 and the thickness Td of the fourth segment P4 (e.g., Ta and/or Tb>Tc+Td).

Figure 7B:
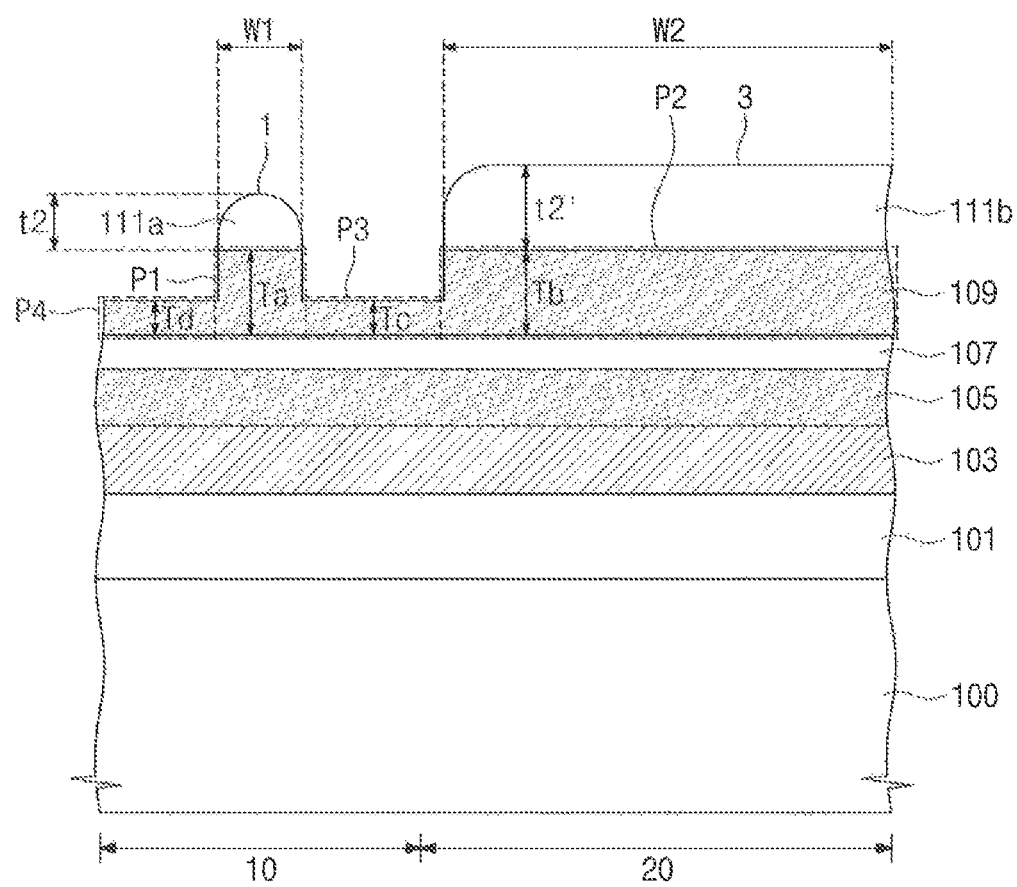

Referring to FIG. 7B, an etching process may be performed to etch the sixth cell etching pattern 111a and the sixth peripheral etching pattern 111b. A three-dimensional etching effect may cause the sixth cell etching pattern 111a to be etched more than the sixth peripheral etching pattern 111b. The thickness t2 of the sixth cell etching pattern 111a may be less than the thickness t2' of the sixth peripheral etching pattern 111b (t2<t2'). The top surface 1 of the sixth cell etching pattern 111a may be located at a different level from that of the top surface 3 of the sixth peripheral etching pattern 111b. For example, the top surface 1 of the sixth cell etching pattern 111a may be located at a lower level than that of the top surface 3 of the sixth peripheral etching pattern 111b. In other words, the top surface 1 of the sixth cell etching pattern 111a may have a lower height than that of the top surface 3 of the sixth peripheral etching pattern 111b. The etching process may use a second etching gas that has an etch selectivity with respect to the fifth etching layer 109. For example, the second etching gas may etch the sixth cell and peripheral etching patterns 111a and 111b faster than the fifth etching layer 109. For example, the top surface 1 of the sixth cell etching pattern 111a may have a convex dome shape or semi-circular shape.

Figure 7C:
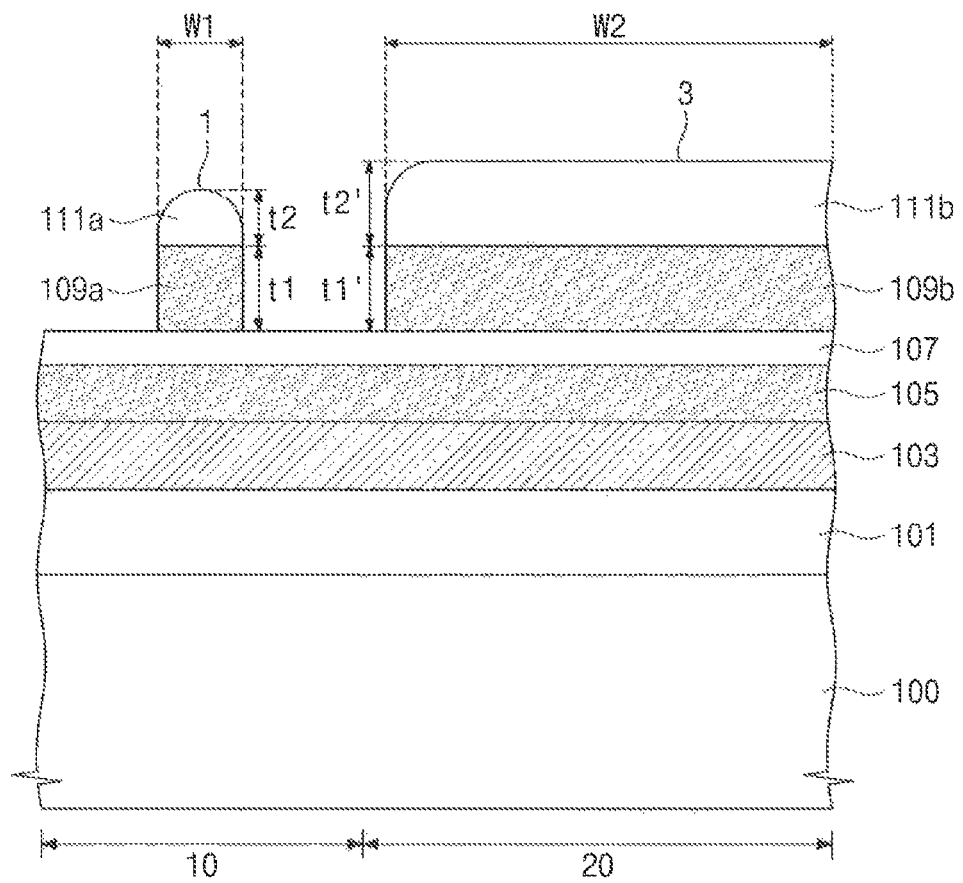

Referring to FIG. 7C, an etching process may be performed in which the sixth cell etching pattern 111a and the sixth peripheral etching pattern 111b are used as an etching mask to etch the third segment P3 and the fourth segment P4 of the fifth etching layer 109. The etching process may form the fifth cell etching pattern 109a and the fifth peripheral etching pattern 109b. In addition, the etching process may expose portions of the top surface of the fourth etching layer 107. The etching process may use a first etching condition. The thickness t1 of the fifth cell etching pattern 109a may be substantially the same as the thickness (see Ta of FIG. 7B) of the first segment P of the fifth etching layer 109, and the thickness t1' of the fifth peripheral etching pattern 109b may be substantially the same as the thickness (see Tb of FIG. 7B) of the second segment P2 of the fifth etching layer 109.

Figure 7D:
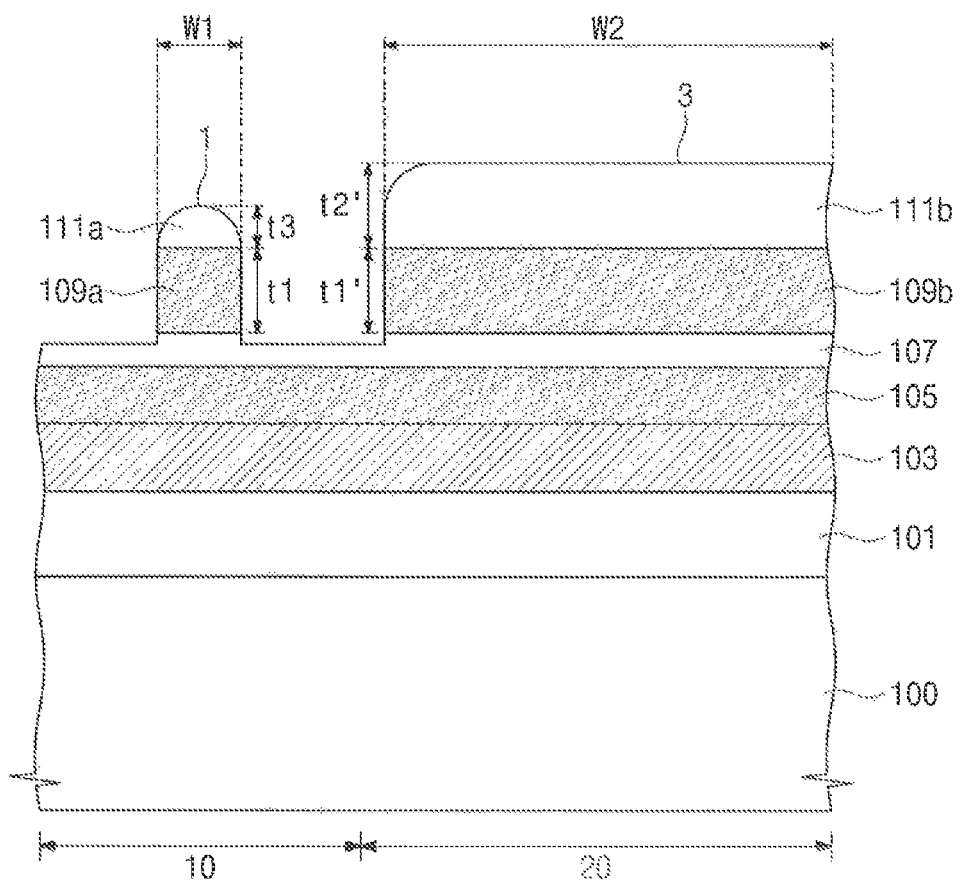

Referring to FIG. 7D, a second etching condition may be used to reduce the thickness t2 of the sixth cell etching pattern 111*a*. The second etching condition may include using a second etching gas to reduce the thickness t2 of the sixth cell etching pattern 111*a*. When the second etching condition is used to etch the sixth cell etching pattern 111*a*, the sixth cell etching pattern 111*a* may be reduced to a thickness t3 less than the thickness t2 before the second etching condition is used. For example, a three-dimensional effect may cause a difference in level between the top surface 1 of the sixth cell etching pattern 111*a* and the top surface 3 of the sixth peripheral etching pattern 111*b* to be greater than a difference in level, shown in FIG. 7C, between the top surface 1 of the sixth cell etching pattern 111*a* and the top surface 3 of the sixth peripheral etching pattern 111*b*. In addition, the fourth etching layer 107 may be recessed at its top surface exposed by the fifth cell etching pattern 109*a* and the fifth peripheral etching pattern 109*b* because the fourth etching layer 107 includes the same material as that of the sixth cell and peripheral etching patterns 111*a* and 111*b*. Subsequent processes are the same as those discussed with reference to FIGS. 1D to 1I, and their explanation will thus be omitted.

Figure 8A:
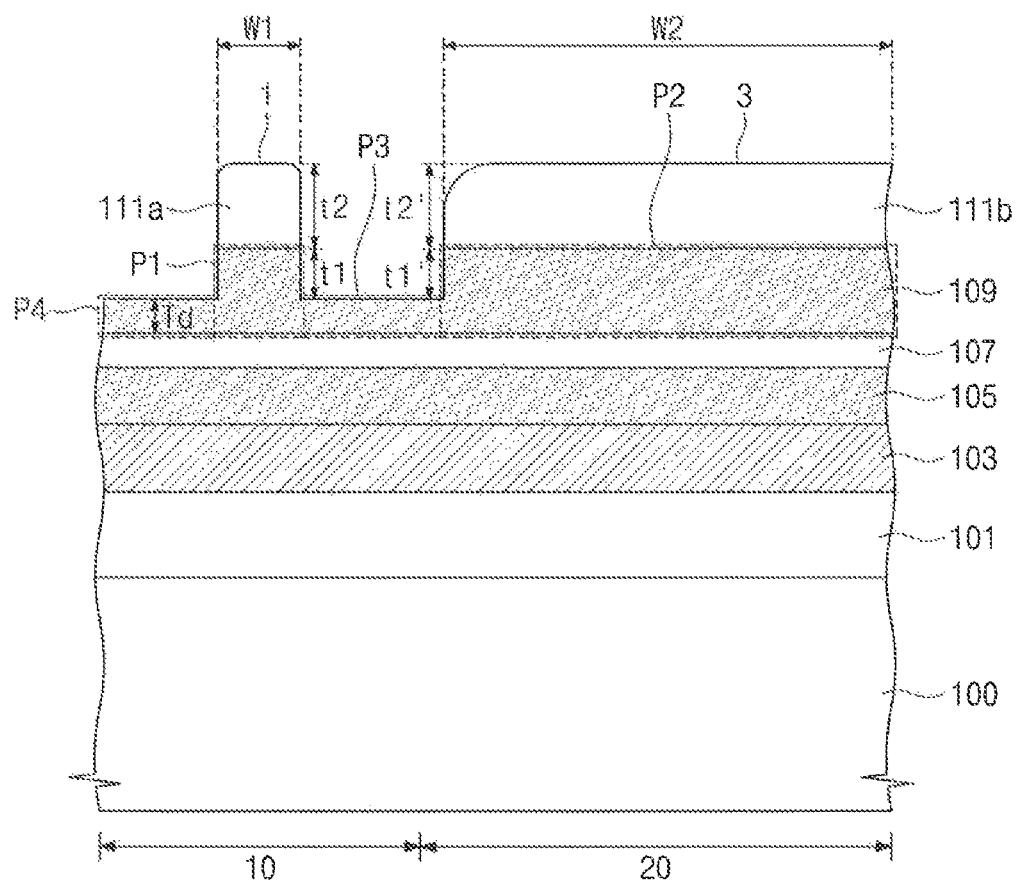
FIGS. 8A and 8B are cross-sectional views illustrating a method of fabricating a semiconductor device according to an exemplary embodiment of the present inventive concept.
Figure 8B:
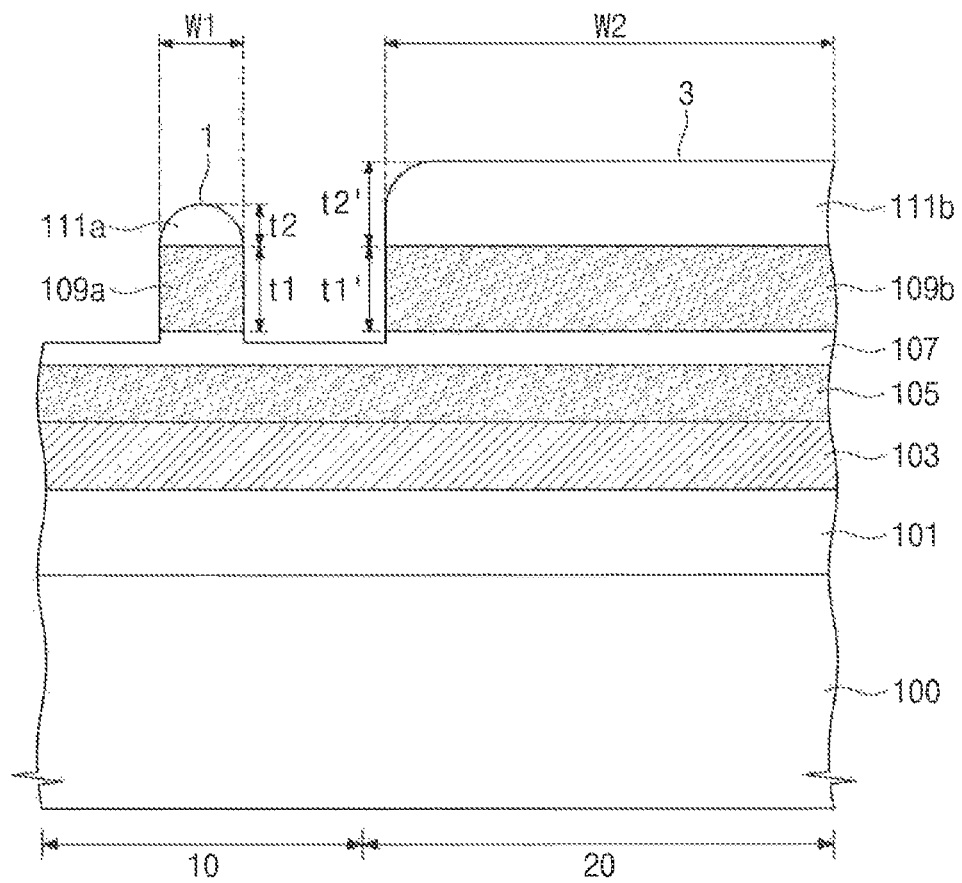

FIGS. 8A and 8B are cross-sectional views illustrating a method of fabricating a semiconductor device according to an exemplary embodiment of the present inventive concept. For brevity of description, components that may be assumed to be substantially the same as those of the semiconductor device discussed above may have the same reference numerals thereto, and a detailed explanation thereof may be omitted.

Referring to FIG. 8A, a process may be performed in which the sixth cell etching pattern 111*a* and the sixth peripheral etching pattern 111*b* are used as an etching mask to recess portions of the top surface of the fifth etching layer 109. The recess process may use a first etching condition that has an etch selectivity with respect to the sixth cell etching pattern 111*a* and the sixth peripheral etching pattern 111*b*. The first etching condition may include employing a bias voltage to have the etch selectivity.

Referring to FIG. 8B, an etching process may be performed in which the sixth cell etching pattern 111*a* and the sixth peripheral etching pattern 111*b* are used as an etching mask to etch the third segment P3 and the fourth segment P4 of the fifth etching layer 109. The etching process may form the fifth cell etching pattern 109*a* and the fifth peripheral etching pattern 109*b*. The etching process may use a second etching condition that has a reduced etch selectivity with respect to the fifth etching layer 109 and has an increased high three-dimensional effect. The second etching condition may include employing a bias voltage higher than that of the first etching condition, and may use the same etching gas as that of the first etching condition. Due to the high bias voltage, the sixth cell and peripheral etching patterns 111*a* and 111*b* may also be etched simultaneously with the fifth etching layer 109. A three-dimensional etching effect may cause the sixth cell etching pattern 111*a* to be etched more than the sixth peripheral etching pattern 111*b*. The thickness t2 of the sixth cell etching pattern 111*a* may be less than the thickness t2' of the sixth peripheral etching pattern 111*b* (t2<t2'). The top surface 1 of the sixth cell etching pattern 111*a* may be located at a lower level than that of the top surface 3 of the sixth peripheral etching pattern 111*b*. The fourth etching layer 107 may be recessed at its top surface exposed by the fifth cell etching pattern 109*a* and the fifth peripheral etching pattern 109*b* because the fourth etching layer 107 includes the same material as that of the sixth cell and peripheral etching patterns 111*a* and 111*b*. When an amount of the sixth cell etching pattern 111*a* remains, even when the fifth etching layer 109 is etched only by the second etching condition, the second etching condition may alone be used to pattern the fifth etching layer 109 and, at the same time, to form a difference in level between the top surfaces 1 and 3 of the sixth cell and peripheral etching patterns 111*a* and 111*b*. For example, the second etching condition may be used to pattern the fifth etching layer 109 and, form a difference in level between the top surfaces 1 and 3 of the sixth cell and peripheral etching patterns 111*a* and 111*b* when a remaining amount of the sixth cell etching pattern 111*a* is greater than an amount of the fifth etching layer 109 that is to be etched. Subsequent processes are the same as those discussed with reference to FIGS. 1D to 1I, and their explanation will thus be omitted.

Figure 9A:
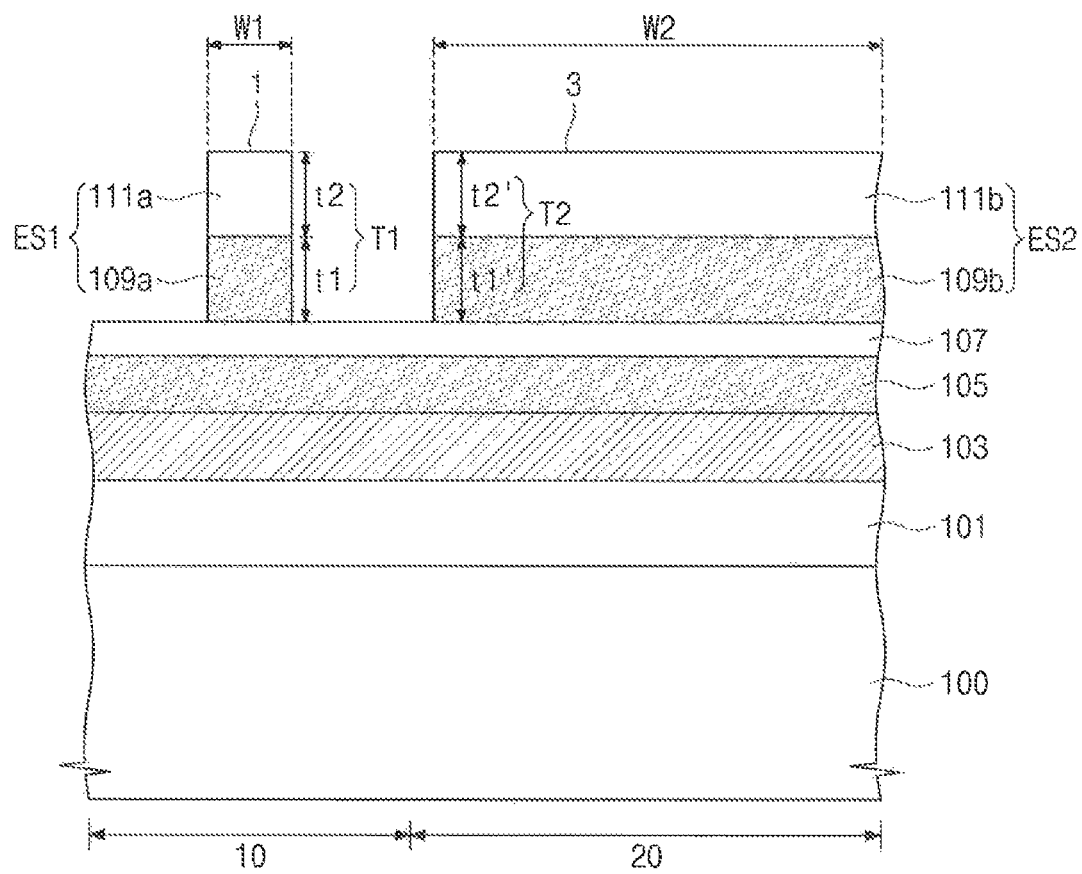
FIGS. 9A and 9B are cross-sectional views illustrating a method of fabricating a semiconductor device according to an exemplary embodiment of the present inventive concept.
Figure 9B:
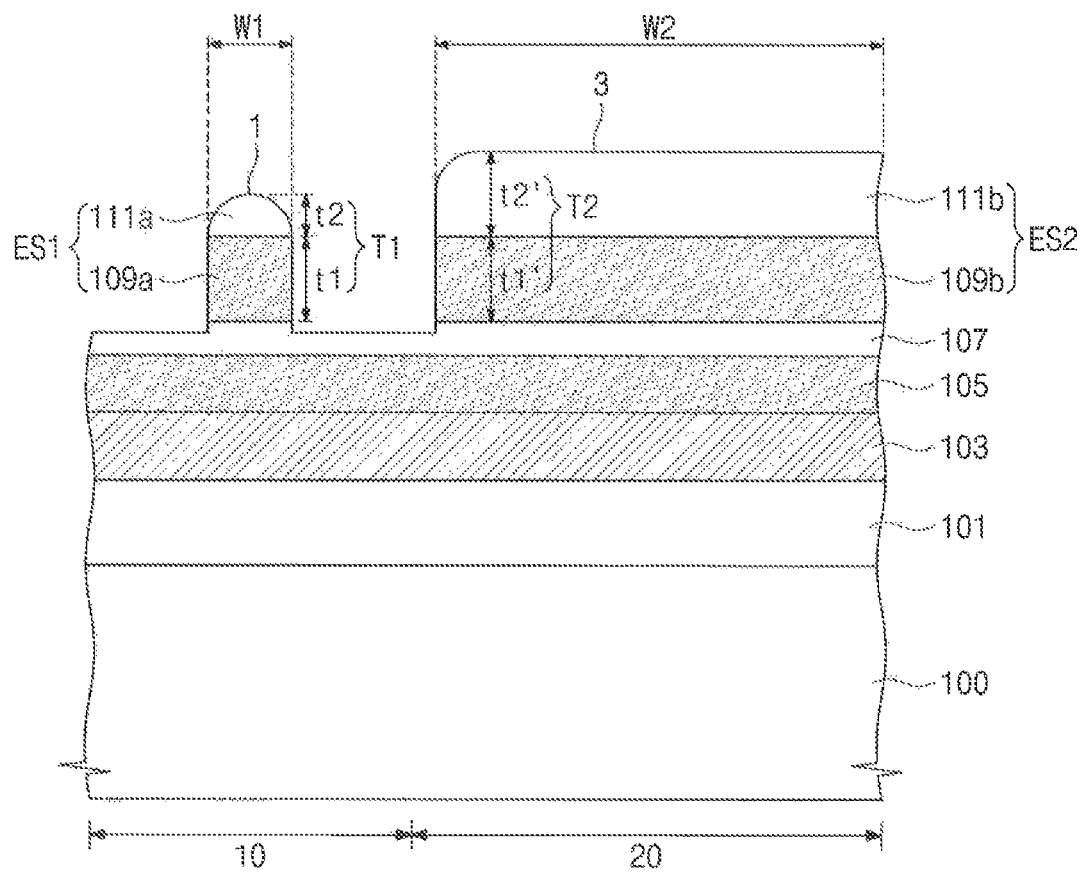

FIGS. 9A and 9B are cross-sectional views illustrating a method of fabricating a semiconductor device according to an exemplary embodiment of the present inventive concept. For brevity of description, components that may be assumed to be substantially the same as those of the semiconductor device discussed above may have the same reference numerals thereto, and a detailed explanation thereof may be omitted.

Referring to FIGS. 1A and 9A, the first mask pattern 113 may be used as an etching mask to pattern the sixth etching layer 111 and the fifth etching layer 109. Therefore, the first etching pattern structure ES1 and the second etching pattern structure ES2 may be formed on the substrate 100. A description discussed with reference to FIG. 1B may be identically applicable to an exemplary embodiment of FIG. 9A, and thus a repetitive description will be omitted.

Referring to FIG. 9B, a cleaning process may be performed to etch the first etching pattern structure ES1 and the second etching pattern structure ES2. The cleaning process may use, for example, hydrofluoric acid (HF). A three-dimensional etching effect may cause the sixth cell etching pattern 111*a* to be etched more than the sixth peripheral etching pattern 111*b*. The thickness T1 of the first etching pattern structure ES1 may be less than the thickness T2 of the second etching pattern structure ES2 (T1<T2), and the top surface 1 of the first etching pattern structure ES1 may be located at a lower level than that of the top surface 3 of the second etching pattern structure ES2. The thickness t2 of the sixth cell etching pattern 111*a* may be less than the thickness t2' of the sixth peripheral etching pattern 111*b* (t2<t2'). The thickness t1 of the fifth cell etching pattern 109*a* may be substantially the same as the thickness t1' of the fifth peripheral etching pattern 109*b* (t1=t1'). The top surface 1 of the sixth cell etching pattern 111*a* may be located at a lower level than that of the top surface 3 of the sixth peripheral etching pattern 111*b*. The fourth etching layer 107 may be recessed at its top surface exposed by the fifth cell etching pattern 109*a* and the fifth peripheral etching pattern 109*b* because the fourth etching layer 107 includes the same material as that of the sixth cell and peripheral etching patterns 111*a* and 111*b*. Subsequent processes are the same as those discussed with reference to FIGS. 1D to 1I, and their explanation will thus be omitted.

According to an exemplary embodiment of the present inventive concept, before a first spacer layer is formed, a three-dimensional etching effect may be utilized to form sixth cell and peripheral etching patterns with top surfaces at different levels from each other. Therefore, to preserve a fifth peripheral etching pattern that has a large width and should be used as an etching mask on a peripheral circuit region of a substrate, a mask pattern formed on the peripheral region of the substrate to locally expose a cell region of the substrate after the first spacer is formed may be omitted. As a result, a fabrication process may be simplified.

While the present inventive concept has been particularly shown and described with reference to exemplary embodiments thereof, it will be apparent to those of ordinary skill in the art that various changes in form and detail may be made thereto without departing from the spirit and scope of the present inventive concept.

What is claimed is:

1. A method of fabricating a semiconductor device, the method comprising:
    forming a first etching pattern structure and a second etching pattern structure on a substrate, wherein the first etching pattern structure has a top surface at a level that is different from that of a top surface of the second etching pattern structure, wherein the first etching pattern structure includes a first cell etching pattern and a second cell etching pattern sequentially stacked on the substrate, wherein the second etching pattern structure includes a first peripheral etching pattern and a second peripheral etching pattern sequentially stacked on the substrate;
    forming a first spacer layer on the first etching pattern structure and the second etching pattern structure, wherein the first spacer layer covers top and lateral surfaces of the first etching pattern structure and top and lateral surfaces of the second etching pattern structure; and
    performing a first etching process on the first spacer layer to form a first spacer on a lateral surface of the first cell etching pattern and a second spacer on the lateral surface of the second etching pattern structure, wherein the first spacer layer is fully exposed during the first etching process of the first spacer layer.

2. The method of claim 1, wherein forming the second cell etching pattern and the second peripheral etching pattern comprises:
    forming a first etching layer on the substrate;
    patterning the first etching layer to form a first cell etching layer and a first peripheral etching layer, wherein the first cell etching layer and the first peripheral etching layer have top surfaces at substantially the same level; and
    performing a second etching process on the first cell etching layer and the first peripheral etching layer to form the second cell etching pattern and the second peripheral etching pattern, respectively,
    wherein a top surface of the second cell etching pattern has a level different from a level of a top surface of the second peripheral etching pattern.

3. The method of claim 1, wherein the top surface of the first etching pattern structure is lower than the top surface of the second etching pattern structure.

4. The method of claim 1, before forming the first etching pattern structure and the second etching pattern structure, further comprising:
    sequentially forming a first etching layer and a second etching layer on the substrate;
    patterning the second etching layer to form a second cell etching layer and a second peripheral etching layer, wherein the second cell etching layer and the second peripheral etching layer have top surfaces at substantially the same level as each other; and
    recessing a top surface of the first etching layer, wherein the top surface of the first etching layer is exposed by the second cell etching layer and the second peripheral etching layer.

5. The method of claim 1, wherein a width of the first etching pattern structure is less than a width of the second etching pattern structure.

6. The method of claim 1, further comprising:
    forming, sequentially, a first etching layer and a second etching layer on the substrate; and
    patterning, sequentially, the second etching layer and the first etching layer to form the first cell etching pattern, the second cell etching pattern, the first peripheral etching pattern, and the second peripheral etching pattern, and
    wherein performing the first etching process further comprises removing the second cell etching pattern to expose the top surface of the first cell etching pattern.

7. The method of claim 1, wherein a thickness of the second spacer is greater than a thickness of the first spacer.

8. The method of claim 2, wherein the first cell etching layer is etched to a greater extent than the first peripheral etching layer.

9. The method of claim 8, wherein the second etching process is a dry etching process or a wet etching process.

10. The method of claim 4, wherein:
    recessing the top surface of the first etching layer comprises using a first etching gas that has an etch selectivity with respect to the first cell etching layer and the first peripheral etching layer, and
    forming the second cell etching pattern and the second peripheral etching pattern comprises using a second etching gas that has an etch selectivity with respect to the first etching layer.

11. The method of claim 4, wherein:
    recessing the top surface of the first etching layer comprises using a first etching gas with a first bias voltage,
    forming the second cell etching pattern and the second peripheral etching pattern comprises using the first etching gas with a second bias voltage greater than the first bias voltage, and
    forming the second cell etching pattern and the second peripheral etching pattern further comprises patterning the first etching layer with the second cell etching pattern and the second peripheral etching pattern to form a first cell etching pattern and a first peripheral etching pattern.

12. The method of claim 6, wherein the second peripheral etching pattern covers the top surface of the first peripheral etching pattern, and the top surface of the first cell etching pattern is exposed.

13. The method of claim 6, further comprising:
    forming a third etching layer, a fourth etching layer, and a fifth etching layer between the substrate and the second etching layer;
    removing the first cell etching pattern to expose an inner sidewall of the first spacer;
    using the first spacer, the second spacer, the second peripheral etching pattern, and the first peripheral etching pattern as an etching mask to pattern the fifth etching layer and the fourth etching layer to form fourth cell and peripheral etching patterns on the third etching layer, a fifth cell etching pattern on a top surface of the fourth cell etching pattern, and a fifth peripheral etching pattern on a top surface of the fourth peripheral etching pattern;

forming a second spacer layer on a lateral surface of the fourth cell etching pattern, lateral and top surfaces of the fifth cell etching pattern, a lateral surface of the fourth peripheral etching pattern, lateral and top surfaces of the fifth peripheral etching pattern, and a portion of a top surface of the third etching layer; and performing a third etching process on the second spacer layer and the third etching layer, wherein the fourth cell etching pattern, the fifth cell etching pattern, the fourth peripheral etching pattern, and the fifth peripheral etching pattern are used as an etching mask to etch the third etching layer to form a third cell etching pattern on the substrate and a third peripheral etching pattern on the substrate, wherein a third spacer is formed on a top surface of the third cell etching pattern, and a fourth spacer is formed on a top surface of the third peripheral etching pattern.

14. A method of fabricating a semiconductor device, the method comprising:

forming a first etching layer, a second cell etching pattern, and a second peripheral etching pattern on a substrate, wherein the second cell etching pattern and the second peripheral etching pattern are formed on a top surface of the first etching layer;

recessing the top surface of the first etching layer, wherein the top surface of the first etching layer is exposed by the second cell etching pattern and the second peripheral etching pattern; and performing a first etching process on the second cell etching pattern and the second peripheral etching pattern, wherein the second cell etching pattern is formed to have a top surface at a lower level than a level of a top surface of the second peripheral etching pattern.

15. The method of claim 14, wherein, before the top surface of the first etching layer is recessed, the top surface of the second cell etching pattern is located at substantially the same level as that of the top surface of the second peripheral etching pattern.

16. The method of claim 14, after performing the first etching process, further comprising using the second cell etching pattern and the second peripheral etching pattern as an etching mask to etch the first etching layer to form a first cell etching pattern and a first peripheral etching pattern.

17. The method of claim 14, wherein, while the first etching process is performed to etch the second cell etching pattern and the second peripheral etching pattern, the first etching layer is etched to form a first cell etching pattern between the substrate and the second cell etching pattern and to form a first peripheral etching pattern between the substrate and the second peripheral etching pattern.

18. The method of claim 14, wherein:

recessing the top surface of the first etching layer comprises using an etch recipe that has an etch selectivity with respect to the second cell etching pattern and the second peripheral etching pattern, and performing the first etching process to etch the second cell etching pattern and the second peripheral etching pattern comprises using an etch recipe that has an etch selectivity with respect to the first etching layer.

19. The method of claim 16, after forming the first cell etching pattern and the first peripheral etching pattern, further comprising performing a second etching process to etch the second cell etching pattern and the second peripheral etching pattern, wherein a difference in level between the top surface of the second cell etching pattern and the top surface of the second peripheral etching pattern after the second etching process is greater than a difference in level between the top surface of the second cell etching pattern and the top surface of the second peripheral etching pattern after the first etching process.

20. The method of claim 17, wherein forming the first cell etching pattern and the first peripheral etching pattern comprises using an etch recipe and a bias voltage, wherein the etch recipe has an etch selectivity with respect to the second cell etching pattern and the second peripheral etching pattern.

* * * * *